United States Patent
Hill

(10) Patent No.: US 6,950,192 B2
(45) Date of Patent: Sep. 27, 2005

(54) CYCLIC ERROR COMPENSATION IN INTERFEROMETRY SYSTEMS

(75) Inventor: Henry A. Hill, Tucson, AZ (US)

(73) Assignee: Zygo Corporation, Middlefield, CT (US)

(*) Notice: Subject to any disclaimer, the term of this patent is extended or adjusted under 35 U.S.C. 154(b) by 211 days.

(21) Appl. No.: 10/616,504

(22) Filed: Jul. 8, 2003

(65) Prior Publication Data

US 2004/0085545 A1 May 6, 2004

Related U.S. Application Data

(60) Provisional application No. 60/394,418, filed on Jul. 8, 2002.

(51) Int. Cl.$^7$ ................................................. G01B 9/07
(52) U.S. Cl. ......................................... 356/498; 956/486
(58) Field of Search ............................... 356/498, 486, 356/487, 492, 500, 493, 517

(56) References Cited

U.S. PATENT DOCUMENTS

| | | |
|---|---|---|
| 4,413,908 A | 11/1983 | Abrams et al. |
| 4,948,254 A | 8/1990 | Ishida |
| 5,151,749 A | 9/1992 | Tanimoto et al. |
| 5,249,016 A | 9/1993 | Tanaka |
| 5,331,400 A | 7/1994 | Wilkening et al. |
| 5,404,222 A | 4/1995 | Lis |
| 5,432,603 A | 7/1995 | Sentoku et al. |
| 5,483,343 A | 1/1996 | Iwamoto et al. |
| 5,491,550 A | 2/1996 | Dabbs |
| 5,663,793 A | 9/1997 | de Groot |
| 5,724,136 A | 3/1998 | Zanoni |
| 5,757,160 A | 5/1998 | Dreuzer |
| 5,764,361 A | 6/1998 | Kato et al. |
| 5,790,253 A | 8/1998 | Kamiya |
| 5,850,291 A | 12/1998 | Tsutsui |
| 5,940,180 A | 8/1999 | Ostby |

(Continued)

FOREIGN PATENT DOCUMENTS

| | | |
|---|---|---|
| DE | 40 31 291 A1 | 6/1992 |
| EP | 0 514 579 A1 | 11/1992 |
| EP | 0 689 030 A2 | 12/1995 |
| JP | 7-351078 | 12/1995 |
| JP | 8-117083 | 4/1996 |
| JP | 10-260009 | 9/1998 |

OTHER PUBLICATIONS

Badami V.G. et al., "Investigation of Nonlinearity in High Accuracy Heterodyne Laser Interferometry," 1997 PROCEEDINGS, vol. 16, pp. 153–156.

(Continued)

Primary Examiner—Gregory J. Toatley, Jr.
Assistant Examiner—Patrick Connolly
(74) Attorney, Agent, or Firm—Fish & Richardson P.C.

(57) ABSTRACT

The invention features a method including: (i) providing an interference signal S(t) from two beams derived from a common source and directed along different paths, wherein the signal S(t) is indicative of changes in an optical path difference $n\bar{L}(t)$ between the different paths, where n is an average refractive index along the different paths, $\bar{L}(t)$ is a total physical path difference between the different paths, and t is time; (ii) providing coefficients representative of one or more errors that cause the signal S(t) to deviate from an ideal expression of the form $A_1 \cos(\omega_R t + \phi(t) + \zeta_1)$, where $A_1$ and $\zeta_1$ are constants, $\omega_R$ is an angular frequency difference between the two beams, and $\phi(t) = nk\bar{L}(t)$, with $k = 2\pi/\lambda$ and $\lambda$ equal to a wavelength for the beams; (iii) calculating a quadrature signal $\tilde{S}(t)$ based on the signal S(t); and (iv) reducing the deviation of S(t) from the ideal expression using an error signal $S_\psi(t)$ generated from the coefficients and error basis functions derived from the signals S(t) and $\tilde{S}(t)$.

67 Claims, 8 Drawing Sheets

U.S. PATENT DOCUMENTS

| | | | |
|---|---|---|---|
| 5,969,800 | A | 10/1999 | Makinouchi |
| 6,008,902 | A | 12/1999 | Rinn |
| 6,020,964 | A | 2/2000 | Loopstra et al. |
| 6,046,792 | A | 4/2000 | Van Der Werf et al. |
| 6,134,007 | A | 10/2000 | Naraki et al. |
| 6,137,574 | A | 10/2000 | Hill |
| 6,160,619 | A | 12/2000 | Magome |
| 6,181,420 | B1 | 1/2001 | Badami et al. |
| 6,201,609 | B1 | 3/2001 | Hill et al. |
| 6,252,668 | B1 * | 6/2001 | Hill .............................. 356/498 |
| 6,271,923 | B1 | 8/2001 | Hill |
| 6,304,318 | B1 | 10/2001 | Matsumoto |
| 6,313,918 | B1 | 11/2001 | Hill et al. |
| 6,687,013 | B2 | 2/2004 | Isshiki et al. |
| 6,747,744 | B2 | 6/2004 | Hill |
| 6,806,961 | B2 | 10/2004 | Hill |
| 2002/0048026 | A1 | 4/2002 | Isshiki et al. |

OTHER PUBLICATIONS

Bennett, S.J. *Optics Communications*, 4:6, pp. 428–430, 1972.

Bobroff, N., "Recent Advances in Displacement Measuring Interferometry," Measurement Science & Technology, vol. 4, No. 9, Sep. 1993, pp. 907–926.

Hines, B. et al., "Sub–Nanometer Laser Metrology—Some Techniques and Models," Jet Propulsion Laboratory, California Institute of Technology, pp. 1195–1204.

Oka K. et al., "Polarization Heterodyne Interferometry Using Another Local Oscillator Beam," Optics Communications, 92 (1992), 1–5.

Wu, C.M. et al., "Analytical Modeling of the Periodic Nonlinearity in Heterodyne Interferometry," Applied Optics, vol. 37, No. 28, Oct. 1, 1998, pp. 6696–6700.

Norman Bobroff, "Residual errors in laser interferometry from air turbulence and nonlinearity", *Applied Optics*, vol. 26, No. 13, pp. 2676–2682.

Mitsuru Tanaka, et al., "Linear Interpolation of Periodic Error in a Heterodyne Laser Interferometer at Subnanometer Levels", *IEEE Transactions on Instrumentation and Measurement*, vol. 38, No. 2, pp. pp. 553–554 (Apr. 1989).

Chien–Ming Wu et al., "Analytical modeling of the periodic nonlinearity in heterodyne interferometry", *Applied Optics*, vol. 37, No. 28, pp. 6696–6700 (Oct. 1, 1998).

Chien–Ming Wu et al., "Nonlinearity in measurements of length by optical interferometry", *Measurement Science and Technology*, vol. 7, No. 1, pp. 62–68 (Jan. 1996).

* cited by examiner

CYCLIC ERROR COMPENSATION IN INTERFEROMETRY SYSTEMS

CROSS-REFERENCE TO RELATED APPLICATIONS

This application claims priority to U.S. Provisional Patent Application Ser. No. 60/394,418 by Henry A. Hill entitled "ELECTRONIC CYCLIC ERROR COMPENSATION" and filed Jul. 8, 2002. The contents of said provisional application being incorporated herein by reference.

BACKGROUND

This invention relates to interferometers, e.g., displacement measuring and dispersion interferometers that measure displacements of a measurement object such as a mask stage or a wafer stage in a lithography scanner or stepper system, and also interferometers that monitor wavelength and determine intrinsic properties of gases.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the relative position of the measurement object correspond to changes in the phase of the measured interference signal, with a $2\pi$ phase change substantially equal to a distance change $L_{RT}$ of $\lambda/(np)$, where $L_{RT}$ is a round-trip distance change, e.g., the change in distance to and from a stage that includes the measurement object.

Unfortunately, this equality is not always exact. Many interferometers include nonlinearities such as what are known as "cyclic errors." The cyclic errors can be expressed as contributions to the phase and/or the intensity of the measured interference signal and have a sinusoidal dependence on the change in optical path length $pnL_{RT}$. For example, a first order harmonic cyclic error in phase has a sinusoidal dependence on $(2\pi pnL_{RT})/\lambda$ and a second order harmonic cyclic error in phase has a sinusoidal dependence on $2(2\pi pnL_{RT})/\lambda$. Additional cyclic errors may include higher order harmonic cyclic errors, negative order harmonic cyclic errors, and sub-harmonic cyclic errors.

Cyclic errors can be produced by "beam mixing," in which a portion of an input beam that nominally forms the reference beam propagates along the measurement path and/or a portion of an input beam that nominally forms the measurement beam propagates along the reference path. Such beam mixing can be caused by ellipticity in the polarizations of the input beams and imperfections in the interferometer components, e.g., imperfections in a polarizing beam splitter used to direct orthogonally polarized input beams along respective reference and measurement paths. Because of beam mixing and the resulting cyclic errors, there is not a strictly linear relation between changes in the phase of the measured interference signal and the relative optical path length pnL between the reference and measurement paths. If not compensated, cyclic errors caused by beam mixing can limit the accuracy of distance changes measured by an interferometer. Cyclic errors can also be produced by imperfections in transmissive surfaces that produce undesired multiple reflections within the interferometer and imperfections in components such as retroreflectors and/or phase retardation plates that produce undesired ellipticities in beams in the interferometer. For a general reference on the theoretical cause of cyclic error, see, for example, C. W. Wu and R. D. Deslattes, "Analytical modelling of the periodic nonlinearity in heterodyne interferometry," *Applied Optics*, 37, 6696–6700, 1998.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used to convert the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged. In addition to the extrinsic dispersion measurement, the conversion of the optical path length to a physical length requires knowledge of an intrinsic value of the gas. The factor $\Gamma$ is a suitable intrinsic value and is the reciprocal dispersive power of the gas for the wavelengths used in the dispersion interferometry. The factor $\Gamma$ can be measured separately or based on literature values. Cyclic errors in the interferometer also contribute to dispersion measurements and measurements of the factor $\Gamma$. In addition, cyclic errors can degrade interferometric measurements used to measure and/or monitor the wavelength of a beam.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

SUMMARY

Among other aspects, the invention features electronic processing methods that characterize and compensate cyclic errors in interferometric data. Because cyclic errors are compensated electronically, the interferometry system that produces the data has greater tolerance to optical, mechanical, and electronic imperfections that can cause cyclic errors, without sacrificing accuracy. The compensation techniques are especially useful for interferometric data used to position microlithographic stage systems.

In part, the invention is based on the realization that prior values of a main interferometric signal can be used to calculate an estimate for a quadrature signal for the main interferometric signal, and that algebraic combinations of such signals can yield sinusoidal functions whose time-varying arguments correspond to particular cyclic error terms. Hereinafter such functions are sometimes referred to as error basis functions. In embodiments in which the interferometer beams have a heterodyne frequency splitting, one may also calculate the quadrature signal of the heterodyne reference signal, and the error basis functions may be derived from algebraic combinations the main signal, the reference signal, and the quadrature signals of the main and reference signals.

The error basis functions are used to isolate particular cyclic error terms in the main signal and characterize coefficients representative each cyclic error term (e.g., its amplitude and phase). For example, algebraic combinations of the error basis functions and the main signal and its quadrature signal can move a selected cyclic error term to zero-frequency, where low-pass filtering techniques (e.g., averaging) can be used to determine its amplitude and phase. Such coefficients are stored. Thereafter, a superposition of the error basis functions weighted by the stored coefficients can be used to generate an error signal that can be subtracted from the main signal to reduce the cyclic errors therein and improve its accuracy.

The technique is particularly useful when the Doppler shift is small relative to the heterodyne frequency because the frequency of each cyclic error term is nearly equal to that of primary component of the main signal, in which case the estimate for the quadrature signal of the main signal is more accurate. This is an especially important property because it is precisely when the frequencies of the cyclic error terms are near that of the primary component of the main signal that the cyclic error terms are most problematic because they cannot be remove by frequency filtering techniques. Furthermore, at small Doppler shifts, one or more of the cyclic error frequencies may be within the bandwidth of a servo system used to position a stage based on the interferometric signal, in which the case the servo loop may actually amplify the cyclic error term when positioning the stage. Small Doppler shifts are actually quite common in microlithographic stage systems, such as when searching for an alignment mark, scanning in an orthogonal dimension to the one monitored by the interferometric signal, and changing stage direction. Moreover, at small Doppler shifts, selecting an integral relationship between the sampling rate of the detector and the heterodyne frequency (e.g., 6:1) yields an especially simple formula for the quadrature signal.

In addition, at small Doppler shifts, the main signal is nearly periodic with the heterodyne frequency, in which case prior data can be used to generate the error signal. As a result, correction of the main signal can be accomplished with only a single real-time subtraction of the error signal from the main signal, significantly reducing the computation time associated with the correction and thereby reducing data age errors in any servo system for position a microlithography stage.

We now summarize various aspects and features of the invention.

In general, in one aspect, the invention features a first method including: (i) providing an interference signal S(t) from two beams derived from a common source and directed along different paths, wherein the signal S(t) is indicative of changes in an optical path difference nL(t) between the different paths, where n is an average refractive index along the different paths, $\tilde{L}$(t) is a total physical path difference between the different paths, and t is time; (ii) providing coefficients representative of one or more errors that cause the signal S(t) to deviate from an ideal expression of the form $A_1 \cos(\omega_R t + \phi(t) + \zeta_1)$, where $A_1$ and $\zeta_1$ are constants, $\omega_R$ is an angular frequency difference between the two beams, and $\phi(t) = nk\tilde{L}(t)$, with $k = 2\pi/\lambda$ and $\lambda$ equal to a wavelength for the beams; (iii) calculating a quadrature signal $\tilde{S}$(t) based on the signal S(t); and (iv) reducing the deviation of S(t) from the ideal expression using an error signal $S_\psi$(t) generated from the coefficients and error basis functions derived from the signals S(t) and $\tilde{S}$(t).

Embodiments of the second method may including any of the following features.

The method may further include directing the two beams along the different paths and measuring the interference signal S(t). For example, at least one of the beams may be directed to reflect from a movable measurement object before producing the interference signal S(t). Furthermore, the beam directed to contact the movable measurement object may reflect from the measurement object multiple times before producing the interference signal S(t). Also, the beams may be directed to reflect from different locations of the movable measurement object before producing the interference signal S(t).

The errors may correspond to spurious beam paths.

The deviation may be expressed as $$\sum_{m,p} A_{m,p} \cos\left(\omega_R t + \frac{m}{p}\varphi(t) + \zeta_{m,p}\right),$$

where p=1, 2, 3 . . . , and m is any integer not equal to p, and where the provided coefficients include information corresponding to at least some of $A_{m,p}$ and $\zeta_{m,p}$.

The angular frequency difference $\omega_R$ may be non-zero.

The method may further include: providing a reference signal $S_R(t)=A_R \cos(\omega_R t+\zeta_R)$, where $A_R$ and $\zeta_R$ are constants; and calculating a quadrature reference signal $\tilde{S}_R(t)$ based on the signal $S_R(t)$, wherein the error basis functions are derived from the signals $S(t)$, $\tilde{S}(t)$, $S_R(t)$, and $\tilde{S}_R(t)$. For example, the method may further include measuring the reference signal $S_R(t)$ based on an output from the common source.

Calculating the quadrature signal $\tilde{S}(t)$ may include calculating the quadrature signal $\tilde{S}(t)$ based on the expression $$\tilde{S}(t) = (\cot \omega_M \tau)S(t-2\tau) - \frac{\cos 2\omega_M \tau}{\sin \omega_M \tau}S(t-\tau),$$

where $\tau>0$ and $\omega_M$ is an instantaneous rate of change of a phase of the interference signal $S(t)$. For example, calculating the quadrature signal $\tilde{S}(t)$ may further include approximating $\omega_M$ according to $\omega_M \approx \omega_R + d\phi(t)/dt$, where $\phi(t)$ in the expression for $\omega_M$ is determined from the interference signal $S(t)$ assuming the deviation of $S(t)$ from the ideal expression is negligible. Alternatively, calculating the quadrature signal $\tilde{S}(t)$ may further include approximating $\omega_M$ according to $\omega_M \approx \omega_R$. In the latter case, calculating the quadrature signal $\tilde{S}(t)$ may include calculating the quadrature signal $\tilde{S}(t)$ according to the simplified expression $$\tilde{S}(t) = \frac{1}{\sqrt{3}}[S(t-\tau) + S(t-2\tau)]$$

for $\tau=(\pi+6\pi N)/3\omega_R$, where N is a non-negative integer.

Calculating the quadrature reference signal $\tilde{S}_R(t)$ may include calculating the quadrature reference signal $\tilde{S}_R(t)$ based on the expression $$\tilde{S}_R(t) = (\cot\omega_R \tau)S_R(t-2\tau) - \frac{\cos 2\omega_R \tau}{\sin\omega_R \tau}S_R(t-\tau),$$

where $\tau>0$. For example, calculating the quadrature reference signal $\tilde{S}_R(t)$ may include calculating the quadrature reference signal $\tilde{S}_R(t)$ according to the simplified expression $$\tilde{S}_R(t) = \frac{1}{\sqrt{3}}[S_R(t-\tau) + S_R(t-2\tau)]$$

for $\tau=(\pi+6\pi N)/3\omega_R$, where N is a non-negative integer.

The interference signal $S(t)$ may be provided at a data rate that is an integer multiple of $\omega_R/2\pi$.

The error basis functions may correspond to one or more pairs of sine and cosine functions having an argument whose time-varying component has the form $\omega_R t+(m/p)\phi(t)$, where p is a positive integer and m is an integer not equal to p. In particular, the error basis functions may correspond to multiple pairs of the sine and cosine functions. For example, the error basis functions may include multiple pairs of the sine and cosine functions from a family of the sine and cosine functions with $\{(p=1,m=-1),(p=1,m=0),(p=1,m=2),(p=1,m=3), \text{ and } (p=2,m=1)\}$.

The method may further include generating the error basis functions from the signals $S(t)$ and $\tilde{S}(t)$.

The method may further include generating the error basis functions from the signals $S(t)$, $\tilde{S}(t)$, $S_R(t)$, and $\tilde{S}_R(t)$. For example, the error basis functions may be generated from algebraic combinations of the signals $S(t)$, $\tilde{S}(t)$, $S_R(t)$, and $\tilde{S}_R(t)$.

The method may further include generating the error signal $S_\psi(t)$. For example, the error signal $S_\psi(t)$ may be generated from a superposition of the error basis functions weighted by the coefficients representative of the errors.

Reducing the deviation may include subtracting the error signal $S_\psi(t)$ from the interference signal $S(t)$.

The method may further include determining a value for the optical path difference $n\tilde{L}(t)$ from the interference signal $S(t)$ after its deviations are reduced.

The quadrature signal $\tilde{S}(t)$ may be calculated from the interference signal $S(t)$ based on prior values of $S(t)$ according to the approximation $S(t) \approx S(t-2\pi N/\omega_R)$, where N is a positive integer.

The error basis functions used to generate the error signal $S_\psi(t)$ may be derived from prior values of the signals $S(t)$ and $\tilde{S}(t)$ according to the approximations $S(t) \approx S(t-2\pi N/\omega_R)$ and $\tilde{S}(t) \approx \tilde{S}(t-2\pi M/\omega_R)$, where N and M are positive integers.

The angular frequency difference may satisfy $\omega_R>100\cdot d\phi(t)/dt$. Furthermore, it may satisfy $\omega_R>500\cdot d\phi(t)/dt$.

In general, in another aspect, the invention features a second method, which includes: (i) providing an interference signal $S(t)$ from two beams derived from a common source and directed along different paths, wherein the signal $S(t)$ is indicative of changes in an optical path difference $n\tilde{L}(t)$ between the different paths, where n is an average refractive index along the different paths, $\tilde{L}(t)$ is a total physical path difference between the different paths, and t is time; (ii) providing coefficients representative of one or more errors that cause the signal $S(t)$ to deviate from an ideal expression of the form $A_1 \cos(\omega_R t+\phi(t)+\zeta_1)$, where $A_1$ and $\zeta_1$ are constants, $\omega_R$ is an angular frequency difference between the two beams, and $\phi(t)=nk\tilde{L}(t)$, with $k=2\pi/\lambda$ and $\lambda$ equal to a wavelength for the beams; and (iii) reducing the deviation of $S(t)$ from the ideal expression using an error signal $S_\psi(t)$ generated from the coefficients and error basis functions derived from the interference signal $S(t)$ based on prior values of $S(t)$ according to the approximation $S(t) \approx S(t-2\pi N/\omega_R)$, where N is a positive integer.

Embodiments of the second method may include any of the following features.

The angular frequency difference may satisfy $\omega_R>100\cdot d\phi(t)/dt$.

The method may further include providing a reference signal $S_R(t)=A_R \cos(\omega_R t+\zeta_R)$, where $\omega_R$ is non-zero and $A_R$ and $\zeta_R$ are constants, and wherein the error basis functions are derived from the signals $S(t)$ and $S_R(t)$. Furthermore, the derivation of the error basis functions may be based on prior values of $S_R(t)$ according to $S_R(t)=S_R(t-2\pi M/\omega_R)$, where M is a positive integer.

Embodiments of the second method may further include any of the features described above in connection with the first method.

In general, in another aspect, the invention features a third method. The third method is for estimating coefficients representative of one or more errors that cause an interference signal $S(t)$ from two beams derived from a common source and directed along different paths to deviate from an ideal expression of the form $A_1 \cos(\omega_R t+\phi(t)+\zeta_1)$, wherein the signal $S(t)$ is indicative of changes in an optical path difference $n\tilde{L}(t)$ between the different paths, where n is an average refractive index along the different paths, $\tilde{L}(t)$ is a total physical path difference between the different paths, t is time, $A_1$ and $\zeta_1$ are constants, $\omega_R$ is an angular frequency difference between the two beams, and $\phi(t)=nk\tilde{L}(t)$, with $k=2\pi/\lambda$ and $\lambda$ equal to a wavelength for the beams. The third method includes: (i) calculating a quadrature signal $\tilde{S}(t)$ based on the signal $S(t)$; and (ii) calculating an estimate for the coefficients based on the signals $S(t)$ and $\tilde{S}(t)$.

Embodiments of the third method may further include any of the following features.

The method may further include: providing a reference signal $S_R(t)=A_R \cos(\omega_R t+\zeta_R)$, where $\omega_R$ is non-zero and $A_R$ and $\zeta_R$ are constants; and calculating a quadrature reference signal $\tilde{S}_R(t)$ based on the signal $S_R(t)$, wherein the estimate for the coefficients is based on the signals $S(t)$, $\tilde{S}(t)$, $S_R(t)$, and $\tilde{S}_R(t)$.

Calculating the estimate for the coefficients may include generating error basis functions derived from the signals $S(t)$ and $\tilde{S}(t)$.

Calculating the estimate for the coefficients may include generating error basis functions derived from the signals $S(t)$, $\tilde{S}(t)$, $S_R(t)$, and $\tilde{S}_R(t)$. For example, the error basis functions may correspond to one or more pairs of sine and cosine functions having an argument whose time-varying component has the form $\omega_R t+(m/p)\phi(t)$, where p is a positive integer and m is an integer not equal to p. Furthermore, the error basis functions may be generated from algebraic combinations of the signals $S(t)$, $\tilde{S}(t)$, $S_R(t)$, and $\tilde{S}_R(t)$.

Also, the error basis functions may correspond to multiple pairs of the sine and cosine functions. For example, the error basis functions may include multiple pairs of the sine and cosine functions from a family of the sine and cosine functions with $\{(p=1,m=-1),(p=1,m=0),(p=1,m=2),(p=1,m=3),$ and $(p=2,m=1)\}$.

Calculating the estimate for the coefficients may include low-pass filtering algebraic combinations of the error basis functions and the signals $S(t)$ and $\tilde{S}(t)$.

Calculating the estimate for the coefficients may include low-pass filtering algebraic combinations of the error basis functions and the signals $S(t)$ and $\tilde{S}(t)$.

For example, the low-pass filtering may include using a Butterworth filter.

Embodiments of the third method may further include any of the features described above in connection with the first method.

In another aspect, the invention features an apparatus including a computer readable medium which during operation causes a processor to perform any of the first, second, or third methods.

In general, in another aspect the invention features a first apparatus including: (i) an interferometry system which during operation directs two beams derived from a common source along different paths and provides an interference signal $S(t)$ from the two beams, wherein the signal $S(t)$ is indicative of changes in an optical path difference $n\tilde{L}(t)$ between the different paths, where n is an average refractive index along the different paths, $\tilde{L}(t)$ is a total physical path difference between the different paths, and t is time, wherein imperfections in the interferometry system produce one or more errors that cause the signal $S(t)$ to deviate from an ideal expression of the form $A_1 \cos(\omega_R t+\phi(t)+\zeta_1)$, where $A_1$ and $\zeta_1$ are constants, $\omega_R$ is an angular frequency difference between the two beams, and $\phi(t)=nk\tilde{L}(t)$, with $k=2\pi/\lambda$ and $\lambda$ equal to a wavelength for the beams; and (ii) an electronic processor which during operation receives the interference signal $S(t)$ from the interferometry system, receives coefficients representative of the one or more errors, calculates a quadrature signal $\tilde{S}(t)$ based on the signal $S(t)$, and reduces the deviation of $S(t)$ from the ideal expression using an error signal $S_\psi(t)$ generated from the coefficients and error basis functions derived from the signals $S(t)$ and $\tilde{S}(t)$.

Embodiments of the first apparatus may include features corresponding to any of the features described above in connection with the first method.

In general, in another aspect, the invention features ann apparatus including: (i) an interferometry system which during operation directs two beams derived from a common source along different paths and provides an interference signal $S(t)$ from the two beams, wherein the signal $S(t)$ is indicative of changes in an optical path difference $n\tilde{L}(t)$ between the different paths, where n is an average refractive index along the different paths, $\tilde{L}(t)$ is a total physical path difference between the different paths, and t is time, wherein imperfections in the interferometry system produce one or more errors that cause the signal $S(t)$ to deviate from an ideal expression of the form $A_1 \cos(\omega_R t+\phi(t)+\zeta_1)$, where $A_1$ and $\zeta_1$ are constants, $\omega_R$ is an angular frequency difference between the two beams, and $\phi(t)=nk\tilde{L}(t)$, with $k=2\pi/\lambda$ and $\lambda$ equal to a wavelength for the beams; and (ii) an electronic processor which during operation receives the interference signal $S(t)$ from the interferometry system, receives coefficients representative of the one or more errors, and reduces the deviation of $S(t)$ from the ideal expression using an error signal $S_\psi(t)$ generated from the coefficients and error basis functions derived from the interference signal $S(t)$ based on prior values of $S(t)$ according to the approximation $S(t) \approx S(t-2\pi N/\omega_R)$, where N is a positive integer.

Embodiments of the second apparatus may include features corresponding to any of the features described above in connection with the second method.

In general, in another aspect, the invention features a third apparatus including: (i) an interferometry system which during operation directs two beams derived from a common source along different paths and provides an interference signal $S(t)$ from the two beams, wherein the signal $S(t)$ is indicative of changes in an optical path difference $n\tilde{L}(t)$ between the different paths, where n is an average refractive index along the different paths, $\tilde{L}(t)$ is a total physical path difference between the different paths, and t is time, wherein imperfections in the interferometry system produce one or more errors that cause the signal $S(t)$ to deviate from an ideal expression of the form $A_1 \cos(\omega_R t+\phi(t)+\zeta_1)$, where $A_1$ and $\zeta_1$ are constants, $\omega_R$ is an angular frequency difference between the two beams, and $\phi(t)=nk\tilde{L}(t)$, with $k=2\pi/\lambda$ and $\lambda$ equal to a wavelength for the beams; and (ii) an electronic processor which during operation receives the interference signal $S(t)$ from the interferometry system, calculates a quadrature signal $\tilde{S}(t)$ based on the signal $S(t)$, and calculates an estimate for the coefficients representative of the one or more errors based on the signals $S(t)$ and $\tilde{S}(t)$.

Embodiments of the third apparatus may include features corresponding to any of the features described above in connection with the third method.

In another aspect, the invention features a lithography system for use in fabricating integrated circuits on a wafer, the system including a stage for supporting the wafer, an illumination system for imaging spatially patterned radiation onto the wafer, a positioning system for adjusting the position of the stage relative to the imaged radiation, and any of the first, second, and third apparatus for monitoring the position of the wafer relative to the imaged radiation.

In another aspect, the invention features a lithography system for use in fabricating integrated circuits on a wafer, the system including a stage for supporting the wafer, and an illumination system including a radiation source, a mask, a positioning system, a lens assembly, and any of the first, second, and third apparatus, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

In a further aspect, the invention features a beam writing system for use in fabricating a lithography mask, the system including a source providing a write beam to pattern a substrate, a stage supporting the substrate, a beam directing assembly for delivering the write beam to the substrate, a positioning system for positioning the stage and beam directing assembly relative one another, and any of the first, second, and third apparatus for monitoring the position of the stage relative to the beam directing assembly.

In another aspect, the invention features a lithography method for use in fabricating integrated circuits on a wafer, the method including supporting the wafer on a moveable stage, imaging spatially patterned radiation onto the wafer, adjusting the position of the stage, and monitoring the position of the stage using any of the first, second, and third methods.

In a further aspect, the invention features a lithography method for use in the fabrication of integrated circuits including directing input radiation through a mask to produce spatially patterned radiation, positioning the mask relative to the input radiation, monitoring the position of the mask relative to the input radiation using any of the first, second, and third methods, and imaging the spatially patterned radiation onto a wafer.

In yet another aspect, the invention features a lithography method for fabricating integrated circuits on a wafer including positioning a first component of a lithography system relative to a second component of a lithography system to expose the wafer to spatially patterned radiation, and monitoring the position of the first component relative to the second component using any of the first, second, and third methods.

In a further aspect, the invention features a method for fabricating integrated circuits, the method including a foregoing lithography method.

In another aspect, the invention features a method for fabricating integrated circuits, the method including using a foregoing lithography system.

In yet another aspect, the invention features a method for fabricating a lithography mask, the method including directing a write beam to a substrate to pattern the substrate, positioning the substrate relative to the write beam, and monitoring the position of the substrate relative to the write beam using any of the first, second, and third methods.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

Other features, objects, and advantages of the invention will be apparent from the following detailed description.

DESCRIPTION OF DRAWINGS

Like reference symbols in the various drawings indicate like elements.

DETAILED DESCRIPTION

Figure 1A:
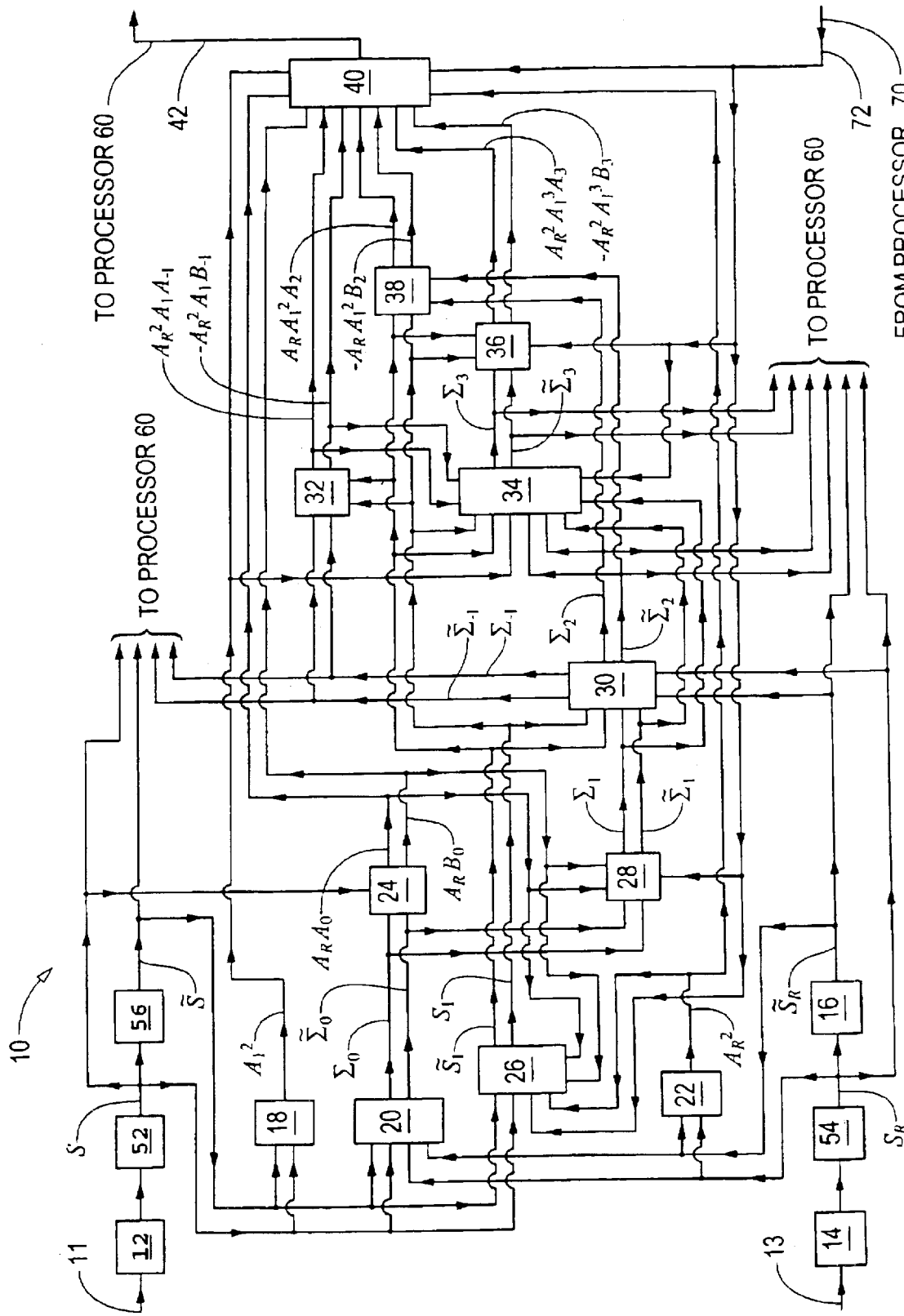
FIG. 1a is a schematic diagram of a processing unit for generating cyclic error basis functions and characterizing cyclic error coefficients based on a main interference signal S(t) and a reference signal $S_R(t)$.

Embodiments include an electronic cyclic error compensation procedure (CEC) for compensation of cyclic error effects in interferometry applications, such as heterodyne interferometry. In preferred embodiments, the compensation is achieved for low slew rates of a plane mirror measurement object attached to a stage or attached to a reference system with associated interferometers attached to a stage. When optical techniques are used to eliminate and/or reduce the amplitudes of certain cyclic errors such as sub-harmonic cyclic errors to $\leq 0.05$ nm ($3\sigma$), the remaining cyclic errors of the harmonic type with amplitudes of 0.5 nm or less can be treated as having constant amplitudes with fixed offset phases and the required accuracy of the cyclic error compensation for a remaining cyclic error term is approximately 10% to meet a compensated cyclic error budget of 0.05 nm ($3\sigma$) or less. Further, the number of cyclic error terms that need to be compensated electronically are typically a small number, e.g., of the order of 3. In preferred embodiments, the processing operations of CEC requiring higher digital processing rates can be limited to a single add operation, whereas the remaining processing operations, which require additions, subtractions, multiplications, and divisions, can be performed at lower rates using prior values of the interference signal.

Typically, cyclic error effects in heterodyne interferometry can be eliminated by filtering the heterodyne signal in frequency space, e.g., using Fourier spectral analysis, when the Doppler shift frequencies can be resolved by the frequency resolution of a phase meter used to determine the heterodyne phase. Unfortunately, such filtering techniques cannot be used to eliminate cyclic error effects at low slew rates of the stage (including, e.g., zero speed of the stage) when the corresponding Doppler shift frequencies cannot be distinguished from the frequency of the primary signal. Further complications arise with cyclic error frequencies are within the bandwidth of the servo system, in which case the cyclic errors can be coupled directly into the stage position through the servo control system, and even amplify the error in the stage position from a desired position.

Specific details of a preferred embodiment of the CEC are described further below. Advantages of that embodiment include a cyclic error correction signal that may be generated in a "feed forward mode," where the feed forward mode can involve a simple digital transform based on a translation in time and need not require a spectral analysis or the use of a digital transform such as a digital Fourier transform, such as a fast Fourier transform (FFT). Likewise, conjugated quadratures of the main interference signal and the reference signal can be generated by simple digital transforms and need not require the use of a digital transform such as a digital Hilbert transform. Moreover, the feed forward mode can reduce the number of computer logic operations that are required at the very highest compute rates and can thereby reduce errors in data age that are introduced by incorporation of CEC.

Another advantage is that the cyclic error coefficients can be characterized at Doppler shift frequencies for which the phase meter cannot distinguish between the cyclic error frequencies from the frequency of the primary component of the interference signal. Furthermore, the cyclic error coefficients can be characterized and used for compensation over a range of Doppler shift frequencies that is small relative to heterodyne frequency, which is a range over which the cyclic error coefficients are typically frequency independent, thereby simplifying the cyclic error correction.

Prior to describing a preferred embodiment of the CEC, it is useful to classify cyclic errors according to properties with respect to the cyclic error amplitudes. Three classifications are set out with reference to a standard high stability plane mirror interferometer (HSPMI). They are: Type 1—Constant amplitude cyclic errors; Type 2—Variable amplitude cyclic errors; and Type 3—Intermittent cyclic errors.

The amplitudes of Type 1 cyclic errors are independent of the orientation of a plane mirror measurement object of a plane mirror interferometer.

The amplitudes of Type 2 cyclic errors are dependent on the orientation of the plane mirror measurement object with a relative variability similar to that experienced by the amplitude of the primary component of the respective electrical interference signal, e.g., $\lesssim \pm 20\%$.

The amplitudes of Type 3 cyclic errors are nominally zero except when the reflecting surface of the plane mirror measurement object is parallel to within $\approx 50$ $\mu$rad of a conjugate image of a reflecting or partially reflecting surface, e.g., the reference mirror, of the interferometer.

Examples of Type 1 cyclic errors are the harmonic cyclic errors generated by polarization mixing in the source of an input beam to the heterodyne interferometer, polarization mixing that is produced by a polarization beam-splitter having finite extinction ratios that splits the input beam into reference and measurement beams, and polarization mixing that is produced by a silver coated cube corner retroreflector such as commonly used in a high stability plane mirror interferometer (HSPMI). The amplitudes of Type 1 cyclic errors are typically $\lesssim 0.25$ nm using techniques such as described in U.S. patent application Ser. No. 10/174,149 entitled "Interferometry System and Method Employing an Angular Difference in Propagation Between Orthogonally Polarized Input Beam Components" to Peter de Groot and Henry A. Hill and filed Jul. 17, 2002, in U.S. Pat. No. 6,201,609 B1 entitled "Interferometers Utilizing Polarization Preserving Optical Systems" to Henry A. Hill, and in U.S. Pat. No. 6,163,379 entitled "Interferometer with Tilted Waveplates for Reducing Ghost Reflections" to Peter de Groot, the contents of which is incorporated herein by reference.

Examples of Type 2 cyclic errors are the harmonic cyclic errors generated by spurious beams due to unwanted reflections by certain surfaces. The typical amplitude of a Type 2 cyclic error is 0.06 nm for a respective surface having a reflectivity of 0.0025. The amplitude of a particular Type 2 cyclic error will typically vary by $\lesssim \pm 20\%$ as the stage mirror is scanned through a range of for example $\pm 500$ $\mu$rad in orientation with a physical separation of $\approx 0.7$ m between the polarizing beam-splitter of an interferometer and plane mirror measurement object.

Examples of Type 3 intermittent cyclic errors are sub-harmonic cyclic errors that have relatively large amplitudes, e.g. 2 nm, when the conditions for Type 3 cyclic errors are met. The Type 3 cyclic errors can be eliminated or reduced to below 0.025 nm (3$\sigma$) by optical techniques where elements of the interferometer are rotated or tilted to eliminate or reduce certain cyclic non-linear errors such as described in U.S. Patent Application Publication No. 2003/0038947 entitled "Tilted Interferometer" to Henry A. Hill, the contents of which are herein incorporated in its entirety by reference. The elimination of Type 3 cyclic errors by the optical techniques considerably reduces the task left for CEC in achieving a compensated cyclic error residual of 0.025 nm (3$\sigma$) or less. Of course, in further embodiments of the invention, sub-harmonic cyclic errors (such as the Type 3 half-cycle error) may also be compensated, as described further below.

The variability of Type 2 cyclic errors expressed in terms of a displacement is typically $\lesssim \pm 0.010$ nm in amplitude. As a consequence, Type 2 cyclic errors can be treated as cyclic errors having constant amplitudes with constant offset phases in implementation of CEC that has a compensated cyclic error budget of 0.01 nm (3$\sigma$) or less.

The number of cyclic error terms that need to be compensated when the Type 3 cyclic errors are eliminated or reduced by the optical techniques are low, e.g. of the order of 3, for a compensated cyclic error budget of 0.05 nm (3$\sigma$) or less. A particular cyclic error term after elimination of Type 3 cyclic errors may comprise one or more Type 1 and/or Type 2 cyclic errors. Nonetheless, in further embodiments, the CEC may also be used to compensate Type 3 cyclic errors.

Additional material describing quantifying and correcting cyclic errors are described in commonly owned U.S. Pat. No. 6,252,668, U.S. Pat. No. 6,246,481, U.S. Pat. No. 6,137,574, U.S. Patent Application Publicaiton No. 2002/0089671, and U.S. patent application Ser. No. 10/287,898 entitled "Interferometric Cyclic Error Compensation" filed Nov. 5, 2002 by Henry A. Hill, the entire contents each of which are incorporated herein by reference.

We now described a preferred embodiment for the CEC that generates in a feed forward mode of operation, in which a cyclic error correction signal $S_\psi(t)$ is subtracted from a corresponding electrical interference signal $S(t)$ of an interferometer to produce a compensated electrical interference signal. The phase of the compensated electrical interference signal is then measured by a phase meter to extract relative path length information associated with the particular interferometer arrangement. Because cyclic error effects have been reduced, the relative path length information is more accurate. As a result, the compensated electrical interference phase can be used to measure and control through a servo control system the position of a stage, even at low slew rates including a zero slew rate where cyclic error effects can otherwise be especially problematic.

Figure 1B:
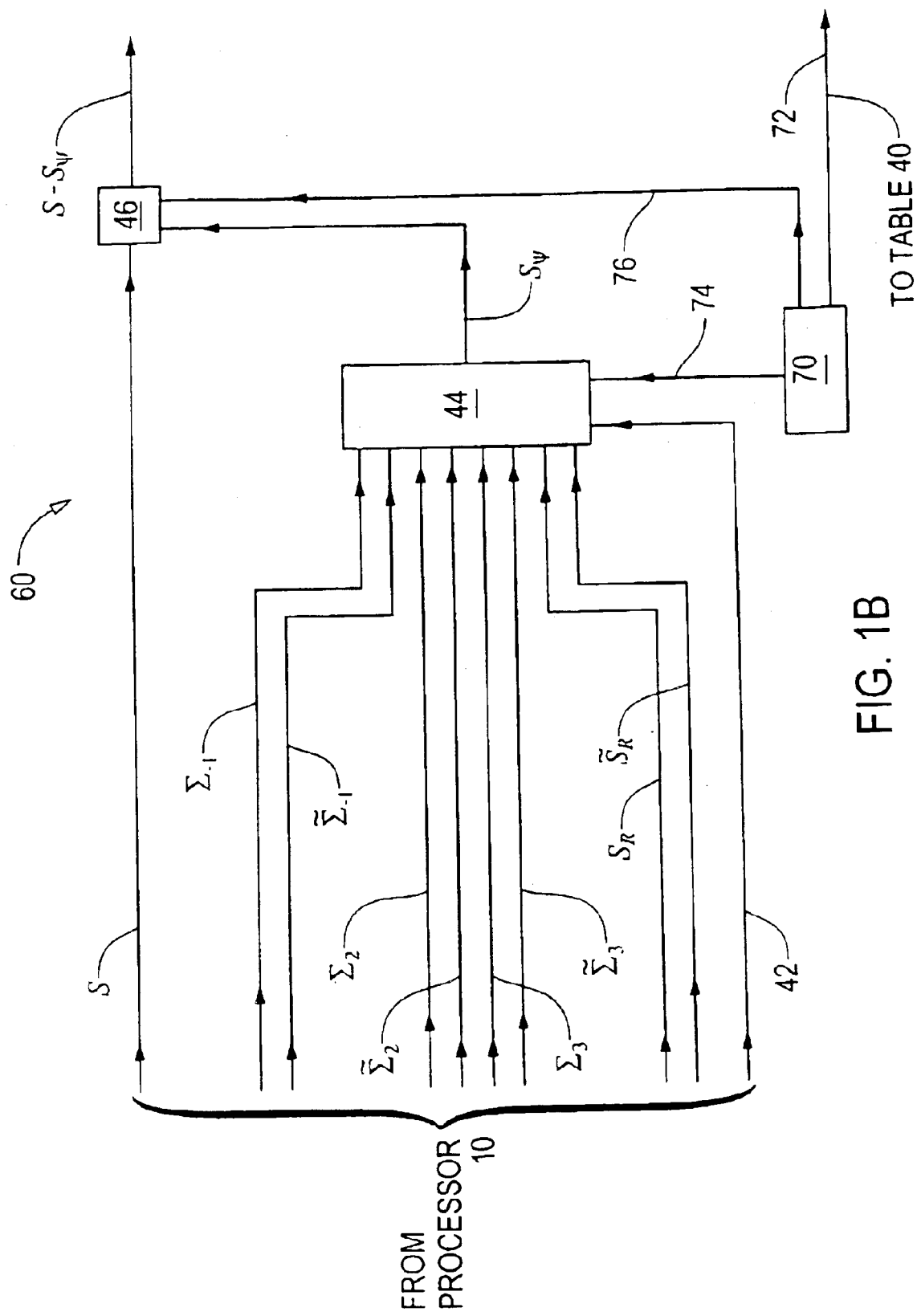
FIG. 1b is a schematic diagram of a processing unit for generating an error signal $S_\psi(t)$ from the cyclic error basis functions and characterized coefficients and using the error signal to reduce cyclic errors in the main interference signal S(t).

Referring to FIGS. 1a and 1b, in a preferred embodiment, the CEC comprises two processing units. One processing unit 10 determines cyclic error basis functions and factors relating to the amplitudes and offset phases of cyclic errors that need be compensated. A second processing unit 60 of CEC generates cyclic error correction signal $S_\psi(t)$ using the cyclic error basis functions and the factors relating to the amplitudes and offset phases determined by first processing unit 10. The first processing unit 10 of CEC for the first embodiment is shown schematically in FIG. 1*a* and the second processing unit 60 of CEC of the first embodiment is shown schematically in FIG. 1*b*.

Referring now to FIG. 1*a*, an optical signal 11 from an interferometer is detected by detector 12 to generate an electrical interference signal. The electrical interference signal is converted to digital format by an analog to digital converter (ADC) in converter/filter 52 as electrical interference signal S(t) and sent to the CEC processor. For example, the ADC conversion rate is a high rate, e.g., 120 MHz.

In the present embodiment, we focus on a particular set of four cyclic error terms are compensated at low slew rates. Adaptation to compensate for a different set of cyclic errors will be evident to one skilled in the art based on the subsequent description. The electrical interference signal S(t) comprising the four cyclic error terms can be expressed in the form $$S(t) = A_1 \cos(\phi_R + \phi + \zeta_1) + S_\psi(t) \tag{1}$$

where $$S_\psi(t) = S_{\psi-1}(t) + S_{\psi 0}(t) + S_{\psi 2}(t) + S_{\psi 3}(t); \tag{2}$$

$$S_{\psi-1}(t) = \epsilon_{-1} \cos(\phi_R - \phi + \zeta_{-1}), \tag{3}$$

$$S_{\psi 0} = \epsilon_0 \cos(\phi_R + \zeta_0), \tag{4}$$

$$S_{\psi 2} = \epsilon_2 \cos(\phi_R + 2\phi + \zeta_2), \tag{5}$$

$$S_{\psi 3} = \epsilon_3 \cos(\phi_R + 3\phi + \zeta_3); \tag{6}$$

$\phi_R$ is the phase of a reference signal $S_R(t)$ with $d\phi_R/dt = \omega_R$ corresponding to $2\pi$ times the frequency difference of the measurement beam and reference beam components of the input beam to the interferometer; $A_1$ and $\zeta_1$ are the amplitude and offset phase, respectively, of the primary component of the electrical interference signal; $\epsilon_{-1}, \epsilon_0, \epsilon_2,$ and $\epsilon_3$ are the amplitudes for the cyclic error terms; $\zeta_{-1}, \zeta_0, \zeta_2,$ and $\zeta_3$ are the offset phases of the cyclic error terms;

$$\phi = 4kL \tag{7}$$

for a plane mirror interferometer such as a HSPMI (which involves two passes of the measurement beam to the measurement object); k is a wavenumber corresponding to wavelength λ of beam 10; and L is the one way physical length of the measurement path relative to the one way physical length of the reference path of the interferometer. Cyclic error amplitudes $\epsilon_{-1}, \epsilon_0, \epsilon_2,$ and $\epsilon_3$ are much less than the $A_1$, i.e. $\leq (1/50)A_1$. An example of the frequency difference $\omega_R/2\pi$ is 20 MHz.

Note that there is generally a set of cyclic error terms whose phases are independent of $\phi_R$. This set of cyclic error terms has been omitted from Equation (2) because they are eliminated by a high pass filter in converter/filter 52.

The factors relating to amplitudes $\epsilon_p$ and offset phases $\zeta_p$ of the cyclic error terms and the time dependent factors of the cyclic error terms are generated using measured values of both S(t) and reference signal $S_R(t)$. The factors relating to amplitudes $\epsilon_p$ and offset phases $\zeta_p$ are determined and the results transmitted to a table 40 for subsequent use in generation of the cyclic error correction signal $S_\psi(t)$. The time dependent factors of the cyclic error terms are obtained by application of simple digital transforms based on trigonometric identities and properties of conjugated quadratures of signals.

Optical reference signal 13 is detected by detector 14 to produce an electrical reference signal. The optical reference signal can be derived from a portion of the input beam to the interferometer. Alternatively, the electrical reference signal can be derived directly from the source that introduces the heterodyne frequency splitting in the input beam components (e.g., from the drive signal to an acousto-optical modulator used to generate the heterodyne frequency splitting). The electrical reference signal is converted to a digital format and passed through a high pass filter in converter/filter 54 to produce reference signal $S_R(t)$. Reference signal $S_R(t)$ in digital format is written as $$S_R = A_R \cos(\phi_R + \zeta_R) \tag{8}$$

where $A_R$ and $\zeta_R$ are the amplitude and offset phase, respectively, of the reference signal. The ADC conversion rate in 54 for $S_R(t)$ is the same as the ADC conversion rate in 52 for S(t). The quadrature signal $\tilde{S}_R(t)$ of $S_R(t)$ written as $$\tilde{S}_R(t) = A_R \sin(\phi_R + \zeta_R) \tag{9}$$

is generated by electronic processing using measured values of $S_R(t)$ according to the formula $$\tilde{S}_R(t) = (\cot \omega_R \tau) S_R(t - 2\tau) - \frac{\cos 2\omega_R \tau}{\sin \omega_R \tau} S_R(t - \tau) \tag{10}$$

where $1/\tau$ is the ADC conversion rate of reference signal $S_R(t)$ in 54. For the example of a frequency difference for $\omega_R/2\pi = 20$ MHz and an ADC conversion rate $1/\tau$ of 120 MHz, Equation (10) reduces to a particularly simple form $$\tilde{S}_R(t) = \frac{1}{\sqrt{3}} [S_R(t - \tau) + S_R(t - 2\tau)]. \tag{11}$$

Reference signal $S_R(t)$ and quadrature signal $\tilde{S}_R(t)$ are conjugated quadratures of reference signal $S_R(t)$. The quadrature signal $\tilde{S}_R(t)$ is generated by processor 16 using Equation (11) or Equation (10) as appropriate.

The quadrature signal $\tilde{S}(t)$ of S(t) is generated by processor 56 using the same processing procedure as that described for the generation of quadrature signal $\tilde{S}_R(t)$. Accordingly, for the example of a ratio of $1/\tau$ and $\omega_R/2\pi$ equal to 6, $$\tilde{S}(t) = \frac{1}{\sqrt{3}} [S(t - \tau) + S(t - 2\tau)] \tag{12}$$

$$= A_0 \sin(\varphi_R + \varphi + \zeta_1) + \tilde{S}_\psi(t)$$

where $$\tilde{S}_\psi(t) = \epsilon_{-1} \sin(\phi_R - \phi + \zeta_{-1}) + \epsilon_0 \sin(\phi_R + \zeta_0) + \epsilon_2 \sin(\phi_R + 2\phi + \zeta_2) + \epsilon_3 \sin(\phi_R + 3\phi + \zeta_3). \tag{13}$$

Equation (12) is valid when the stage slew rate is low, e.g., when $\phi$ changes insignificantly over the time period $2\tau$. Signal S(t) and quadrature signal $\tilde{S}(t)$ are conjugated quadratures of signal S(t).

Notably, the integral relationship between $1/\tau$ and $\omega_R/2\pi$ allows the generation of feed forward values S'(t) and $\tilde{S}'(t)$ of S(t) and $\tilde{S}(t)$, respectively, and $S'_R(t)$ and $\tilde{S}'_R(t)$ of $S_R(t)$ and $\tilde{S}_R(t)$, respectively, are according to the formulae $$S'(t) = S(t-6m\tau), \tag{14}$$

$$\tilde{S}'(t) = \tilde{S}(t-6m\tau), \tag{15}$$

$$S'_R(t) = S_R(t-6m\tau), \tag{16}$$

$$\tilde{S}'_R(t) = \tilde{S}_R(t-6m\tau) \tag{17}$$

where m is an integer such that the error in the phases of feed forward signals with respect to corresponding phases of signals is less than predetermined values set by an end use application. In other words, prior values of the main interference signal and the reference signal can be used to generate the quadrature signals and subsequent error basis functions. In other embodiments in which the ratio between $1/\tau$ and $\omega_R/2\pi$ is an integer different from 6, Equations (14)–(17) are modified accordingly.

Using algebraic combinations of the signals $S(t)$, $\tilde{S}(t)$, $S_R(t)$, and $\tilde{S}_R(t)$, processing unit 10 generates cyclic error basis functions, which are sine and cosine functions that have the same time-varying arguments as the cyclic error terms, and then uses the cyclic error basis functions to project out respective cyclic error coefficients from $S(t)$ and $\tilde{S}(t)$ by low-pas filtering (e.g., averaging). The cyclic error basis functions for $S_{\psi 0}(t)$, for example, are especially simple and correspond to the reference signal and its quadrature signal $S_R(t)$, and $\tilde{S}_R(t)$. In other words, to process the signals for information about the cyclic error term $\epsilon_0 \cos(\phi_R + \zeta_0)$, signals $S_R(t)$ and $\tilde{S}_R(t)$ are used as time dependent factors in the representation of the cyclic error term $\epsilon_0 \cos(\phi_R + \zeta_0)$.

To better understand the representation, it is beneficial to rewrite cyclic error term $\epsilon_0 \cos(\phi_R + \zeta_0)$ in terms of the time dependent functions $\cos(\phi_R + \zeta_R)$ and $\sin(\phi_R + \zeta_R)$ with the results $$\varepsilon_0 \cos(\varphi_R + \zeta_0) = \varepsilon_0 \begin{bmatrix} \cos(\zeta_0 - \zeta_R)\cos(\varphi_R + \zeta_R) - \\ \sin(\zeta_0 - \zeta_R)\sin(\varphi_R + \zeta_R) \end{bmatrix}, \tag{18}$$

$$\varepsilon_0 \sin(\varphi_R + \zeta_0) = \varepsilon_0 \begin{bmatrix} \cos(\zeta_0 - \zeta_R)\sin(\varphi_R + \zeta_R) + \\ \sin(\zeta_0 - \zeta_R)\cos(\varphi_R + \zeta_R) \end{bmatrix}. \tag{19}$$

Equations (18) and (19) can be rewritten as $$\varepsilon_0 \cos(\varphi_R + \zeta_0) = [A_0 \cos(\varphi_r + \zeta_R) - B_0 \sin(\varphi_R + \zeta_R)], \tag{20}$$

$$\varepsilon_0 \sin(\varphi_R + \zeta_0) = [A_0 \sin(\varphi_R + \zeta_R) + B_0 \cos(\varphi_R + \zeta_R)] \tag{21}$$

where $$A_0 = \epsilon_0 \cos(\zeta_0 - \zeta_R), \tag{22}$$

$$B_0 = \epsilon_0 \sin(\zeta_0 - \zeta_R). \tag{23}$$

Conjugated quadratures $S(t)$ and $\tilde{S}(t)$ and conjugated quadratures $S_R(t)$ and $\tilde{S}_R(t)$ are transmitted to processor 20 wherein signals $\Sigma_0(t)$ and $\tilde{\Sigma}_0(t)$ are generated. Signals $\Sigma_0(t)$ and $\tilde{\Sigma}_0(t)$ are given by the equations $$\Sigma_0(t) = S(t)S_R(t) + \tilde{S}(t)\tilde{S}_R(t), \tag{24}$$

$$\tilde{\Sigma}_0(t) = -S(t)\tilde{S}_R(t) + \tilde{S}(t)S_R(t). \tag{25}$$

Using properties of conjugated quadratures and certain trigonometric identities, e.g., $\cos^2 \gamma + \sin^2 \gamma = 1$, we have $$\Sigma_0(t) = A_R A_0 + A_R \begin{bmatrix} A_1 \cos(\varphi + \zeta_1 - \zeta_R) + \varepsilon_{-1}\cos(-\varphi + \zeta_{-1} - \zeta_R) + \\ \varepsilon_2 \cos(2\varphi + \zeta_2 - \zeta_R) + \varepsilon_3 \cos(3\varphi + \zeta_3 - \zeta_R) \end{bmatrix}, \tag{26}$$

$$\tilde{\Sigma}_0(t) = A_R B_0 + A_R \begin{bmatrix} A_1 \sin(\varphi + \zeta_1 - \zeta_R) + \varepsilon_{-1}\sin(-\varphi + \zeta_{-1} - \zeta_R) + \\ \varepsilon_2 \sin(2\varphi + \zeta_2 - \zeta_R) + \varepsilon_3 \sin(3\varphi + \zeta_3 - \zeta_R) \end{bmatrix}. \tag{27}$$

Notably, the generation of signals $\Sigma_0(t)$ and $\tilde{\Sigma}_0(t)$ project the coefficients associated with $S_{\psi 0}(t)$ to zero frequency, where low-pass filtering techniques can be used to determine them. Thus, signals $\Sigma_0(t)$ and $\tilde{\Sigma}_0(t)$ are transmitted to low pass digital filters in processor 24, e.g., low pass Butterworth filters, where coefficients $A_R A_0$ and $A_R B_0$ are determined.

For a Butterworth filter $T_n(x)$ of order n, the corresponding outputs of the low pass digital filters for inputs $\Sigma_0(t)$ and $\tilde{\Sigma}_0(t)$ are $$T_n\left[\sum_1 (t)\right] = A_R A_0 + A_R \begin{bmatrix} A_1 O\left(\frac{\omega_C}{\omega_D}\right)^n + \varepsilon_{-1} O\left(\frac{\omega_C}{\omega_D}\right)^n + \\ \varepsilon_2 O\left(\frac{\omega_C}{2\omega_D}\right)^n + \varepsilon_3 O\left(\frac{\omega_C}{3\omega_D}\right)^n \end{bmatrix}, \tag{28}$$

$$T_n\left[\tilde{\sum}_0 (t)\right] = A_R B_0 + A_R \begin{bmatrix} A_1 O\left(\frac{\omega_C}{\omega_D}\right)^n + \varepsilon_{-1} O\left(\frac{\omega_C}{\omega_D}\right)^n + \\ \varepsilon_2 O\left(\frac{\omega_C}{2\omega_D}\right)^n + \varepsilon_3 O\left(\frac{\omega_C}{3\omega_D}\right)^n \end{bmatrix} \tag{29}$$

where $O(x)$ denotes a term of the order of x, $\omega_c$ is the −3 dB angular cutoff frequency, and $\omega_D = d\phi/dt$.

The terms on the right hand sides of Equations (28) and (29) with factors $A_R A_1$ are the sources of the largest errors and accordingly determine the specifications of n and the minimum ratio for $\omega_D/\omega_c$ that can be used when the outputs of processor 24 are stored in table 40. For a fourth order Butterworth filter, i.e., n=4, and a minimum ratio for $\omega_D/\omega_c = 7$, the error terms on the right hand side of Equations (28) and (29) will generate errors that correspond to $\leq 0.010$ nm (3σ). When the stage is moving at a speed such that the corresponding Doppler shift frequency $\omega_D/2\pi$ is 10 to 100 times greater than the bandwidth of the stage servo control system and the requirement with respect to $\omega_D/\omega_c$ is satisfied, the outputs $A_R A_0$ and $A_R B_0$ of the low pass filters in processor 24 are stored in table 40 and in processors 26 and 28 under the control of signal 72.

Notably, in this preferred embodiment, $\omega_D$ can vary by factors such as 2 or more during the period associated with output values of $A_R A_0$ and $A_R B_0$ that are stored in table 40.

Quadratures $S_R$ and $\tilde{S}_R$ are transmitted to processor 22 and the value for $A_R^2$ is determined in processor 22 by a procedure similar to that used in processor 20 and processor 24 using the formulae $$T_n[S_R(t) \cdot S_R(t) + \tilde{S}_R(t) \cdot \tilde{S}_R(t)] = A_R^2. \tag{30}$$

The value of the order n need only be for example 2. Values of $A_R^2$ are transmitted to table 40 and stored under the control of signal 72.

The values for $A_R A_0$, $A_R B_0$, $S(t)$, $\tilde{S}(t)$, and $A_R^2$ are transmitted to processor 26 and the values of $A_R A_0$, $A_R B_0$, and $A_R^2$ are stored in processor 26 under the control of signal 72 for the generation of conjugated quadratures $S_1(t)$ and $\tilde{S}_1(t)$ where $$S_1(t) \equiv S(t) - \frac{(A_R A_0)}{A_R^2} S_R + \frac{(A_R B_0)}{A_R^2} \tilde{S}_R \qquad (31)$$
$$= A_1 \cos(\varphi_R + \varphi + \zeta_1) + \varepsilon_{-1} \cos(\varphi_R - \varphi + \zeta_{-1}) +$$
$$\varepsilon_2 \cos(\varphi_R + 2\varphi + \zeta_2) + \varepsilon_3 \cos(\varphi_R + 3\varphi + \zeta_3),$$

$$\tilde{S}_1(t) \equiv \tilde{S}(t) - \frac{(A_R A_0)}{A_R^2} \tilde{S}_R - \frac{(A_R B_0)}{A_R^2} \tilde{S}_R \qquad (32)$$
$$= A_1 \sin(\varphi_R + \varphi + \zeta_1) + \varepsilon_{-1} \sin(\varphi_R - \varphi + \zeta_{-1}) +$$
$$\varepsilon_2 \sin(\varphi_R + 2\varphi + \zeta_2) + \varepsilon_3 \sin(\varphi_R + 3\varphi + \zeta_3).$$

The values for $A_R A_0$, $A_R B_0$, $\Sigma_0(t)$, and $\tilde{\Sigma}_0(t)$ are transmitted to processor 28 and the values of $A_R A_0$ and $A_R B_0$ are stored in processor 28 under the control of signal 72 for the generation of conjugated quadratures $\Sigma_1(t)$ and $\tilde{\Sigma}_1(t)$ where $$\sum_1 (t) \equiv \sum_0 (t) - A_R A_0 \qquad (33)$$
$$= A_R \begin{bmatrix} A_1 \cos(\varphi + \zeta_1 - \zeta_R) + \varepsilon_{-1} \cos(-\varphi + \zeta_{-1} - \zeta_R) + \\ \varepsilon_2 \cos(2\varphi + \zeta_2 - \zeta_R) + \varepsilon_3 \cos(3\varphi + \zeta_3 - \zeta_R) \end{bmatrix},$$

$$\tilde{\sum}_1 (t) \equiv \tilde{\sum}_0 (t) - A_R B_0 \qquad (34)$$
$$= A_R \begin{bmatrix} A_1 \sin(\varphi + \zeta_1 - \zeta_R) + \varepsilon_{-1} \sin(-\varphi + \zeta_{-1} - \zeta_R) + \\ \varepsilon_2 \sin(2\varphi + \zeta_2 - \zeta_R) + \varepsilon_3 \sin(3\varphi + \zeta_3 - \zeta_R) \end{bmatrix}.$$

Signals $S_R(t)$, $\tilde{S}_R(t)$, $\Sigma_1(t)$, and $\tilde{\Sigma}_1(t)$ are transmitted to processor 30 for the generation of conjugated quadratures $\Sigma_{-1}(t)$ and $\tilde{\Sigma}_{-1}(t)$ where $$\sum_{-1}(t) \equiv \sum_1 S_R + \sum_1 \tilde{S}_R \qquad (35)$$
$$= A_R^2 \begin{bmatrix} \varepsilon_{-1} \cos(\varphi_R + \varphi - \zeta_{-1} + 2\zeta_R) + \\ A_1 \cos(\varphi_R - \varphi - \zeta_1 + 2\zeta_R) + \\ \varepsilon_2 \cos(\varphi_R - 2\varphi - \zeta_2 + 2\zeta_R) + \\ \varepsilon_3 \cos(\varphi_R - 3\varphi - \zeta_3 + 2\zeta_R) \end{bmatrix},$$

$$\sum_{-1}(t) \equiv \sum_1 \tilde{S}_R - \sum_1 S_R \qquad (36)$$
$$= A_R^2 \begin{bmatrix} \varepsilon_{-1} \sin(\varphi_R + \varphi - \zeta_{-1} + 2\zeta_R) + \\ A_1 \sin(\varphi_R - \varphi - \zeta_1 + 2\zeta_R) + \\ \varepsilon_2 \sin(\varphi_R - 2\varphi - \zeta_2 + 2\zeta_R) + \\ \varepsilon_3 \sin(\varphi_R - 3\varphi - \zeta_3 + 2\zeta_R) \end{bmatrix}.$$

Signals $\Sigma_{-1}(t)$ and $\tilde{\Sigma}_{-1}(t)$ correspond to the cyclic error basis functions for $S_{\psi,-1}(t)$ in that the leading terms of $\Sigma_{-1}(t)$ and $\tilde{\Sigma}_{-1}(t)$ are sinusoids with the same time-varying argument as that of $S_{\psi,-1}(t)$.

Coefficients $A_R^2 A_1 A_{-1}$ and $-A_R^2 A_1 B_{-1}$ are next determined through digital low pass filters, e.g., low pass Butterworth filters, in processor 32 where $$A_{-1} = \varepsilon_{-1} \cos(\zeta_{-1} + \zeta_1 - 2\zeta_R), \qquad (37)$$

$$B_{-1} = \varepsilon_{-1} \sin(\zeta_{-1} + \zeta_1 - 2\zeta_R). \qquad (38)$$

The input signals for the digital filters are $\Sigma_4(t)$ and $\tilde{\Sigma}_4(t)$. Input signals $\Sigma_4(t)$ and $\tilde{\Sigma}_4(t)$ are generated in processor 32 using signals $S_1$, $\tilde{S}_1$, $\Sigma_{-1}(t)$, and $\tilde{\Sigma}_{-1}(t)$ according to the formulae $$\Sigma_4(t) = [S_1(t)\Sigma_{-1}(t) + \tilde{S}_1(t)\tilde{\Sigma}_{-1}(t)], \qquad (39)$$

$$\tilde{\Sigma}_4(t) = [\tilde{S}(t)\Sigma_{-1}(t) - \tilde{S}(t)\tilde{\Sigma}_{-1}(t)]. \qquad (40)$$

Equations (39) and (40) are written in terms of $A_{-1}$ and $B_{-1}$ using Equations (37) and (38) as $$\sum_4 = 2A_R^2 A_1 A_{-1} \qquad (41)$$
$$+ A_R^2 A_1 \begin{bmatrix} A_1 \cos(-2\varphi - \zeta_1 - \zeta_1 + 2\zeta_R) + \\ 2\varepsilon_2 \cos(-3\varphi - \zeta_1 - \zeta_2 + 2\zeta_R) + \\ 2\varepsilon_3 \cos(-4\varphi - \zeta_1 - \zeta_3 + 2\zeta_R) \end{bmatrix}$$
$$+ A_R^2 O(\varepsilon_i \varepsilon_j),$$

$$\tilde{\sum}_4 = -2A_R^2 A_1 B_{-1} \qquad (42)$$
$$+ A_R^2 A_1 \begin{bmatrix} A_1 \sin(-2\varphi - \zeta_1 - \zeta_1 + 2\zeta_R) + \\ 2\varepsilon_2 \sin(-3\varphi - \zeta_1 - \zeta_2 + 2\zeta_R) + \\ 2\varepsilon_3 \sin(-4\varphi - \zeta_1 - \zeta_3 + 2\zeta_R) \end{bmatrix}$$
$$+ A_R^2 O(\varepsilon_i \varepsilon_j),$$

Signals $\Sigma_4(t)$ and $\tilde{\Sigma}_4(t)$ are sent to low pass digital filters in processor 32, e.g., low pass Butterworth filters, where coefficients $2A_R^2 A_1 A_{-1}$ and $-2A_R^2 A_1 B_{-1}$ are determined. For a Butterworth filter $T_n(x)$ of order n, the corresponding outputs of the low pass digital filters for inputs $\Sigma_4(t)$ and $\tilde{\Sigma}_4(t)$ are $$T_n[\sum_4 (t)] = 2A_R^2 A_1 A_{-1} + \qquad (43)$$
$$A_R^2 A_1 \left[ A_1 O\left(\frac{\omega_c}{2\omega_D}\right)^n + 2\varepsilon_2 O\left(\frac{\omega_c}{3\omega_D}\right)^n + 2\varepsilon_3 O\left(\frac{\omega_c}{4\omega_D}\right)^n \right],$$

$$T_n[\tilde{\sum}_4 (t)] = -2A_R^2 A_1 B_{-1} + \qquad (44)$$
$$A_R^2 A_1 \left[ A_1 O\left(\frac{\omega_c}{2\omega_D}\right)^n + 2\varepsilon_2 O\left(\frac{\omega_c}{3\omega_D}\right)^n + 2\varepsilon_3 O\left(\frac{\omega_c}{4\omega_D}\right)^n \right].$$

The terms on the right hand sides of Equations (43) and (44) with factors $A_R^2 A_1^2$ are the sources of the largest errors and accordingly determine the specifications of n and the minimum ratio for $\omega_D/\omega_c$ that can be used when the outputs of processor 32 are stored in table 40. For a fourth order Butterworth filter, i.e., n=4, and a minimum ratio for $\omega_D/\omega_c=$ 3.5, the error terms on the right hand side of Equations (43) and (44) will generate errors that correspond to $\leq 0.010$ nm (3σ). The outputs $2A_R^2 A_1 A_{-1}$ and $-2A_R^2 A_1 B_{-1}$ of low pass filters of processor 32 are divided by 2 to generate $A_R^2 A_1 A_{-1}$ and $-A_R^2 A_1 B_{-1}$ as the outputs of processor 32. When the stage is moving at a speed such that the corresponding Doppler shift frequency $\omega_D/2\pi$ is 10 to 100 times greater than the bandwidth of the stage servo control system and the requirement with respect to $\omega_D/\omega_c$ is satisfied, the outputs $A_R^2 A_1 A_{-1}$ and $-A_R^2 A_1 B_{-1}$ of processor 32 are stored in table 40 and in processor 34 under the control of signal 72.

Signals $S_1(t)$ and $\tilde{S}_1(t)$ are transmitted to processor 30 for the generation of conjugated quadratures $\Sigma_2(t)$ and $\tilde{\Sigma}_2(t)$ where $$\Sigma_2(t) \equiv S_1 \cdot \sum_1 - \tilde{S}_1 \cdot \tilde{\sum}_1 \quad (45)$$

$$= A_R A_1 \begin{bmatrix} A_1 \cos(\varphi_R + 2\varphi + 2\zeta_1 - \zeta_R) + \\ 2\varepsilon_{-1} \cos(\varphi_R + \zeta_1 + \zeta_{-1} - \zeta_R) + \\ 2\varepsilon_2 \cos(\varphi_R + 3\varphi + \zeta_1 + \zeta_2 - \zeta_R) + \\ 2\varepsilon_3 \cos(\varphi_R + 4\varphi + \zeta_1 + \zeta_3 - \zeta_R) \end{bmatrix} +$$

$$A_R O(\varepsilon_i \varepsilon_j),$$

$$\tilde{\Sigma}_2(t) \equiv S_1 \cdot \tilde{\sum}_1 - \tilde{S}_1 \cdot \sum_1 \quad (46)$$

$$= A_R A_1 \begin{bmatrix} A_1 \sin(\varphi_R + 2\varphi + 2\zeta_1 - \zeta_R) + \\ 2\varepsilon_{-1} \sin(\varphi_R + \zeta_1 + \zeta_{-1} - \zeta_R) + \\ 2\varepsilon_2 \sin(\varphi_R + 3\varphi + \zeta_1 + \zeta_2 - \zeta_R) + \\ 2\varepsilon_3 \sin(\varphi_R + 4\varphi + \zeta_1 + \zeta_3 - \zeta_R) \end{bmatrix} +$$

$$A_R O(\varepsilon_i \varepsilon_j).$$

Signals $\Sigma_2(t)$ and $\tilde{\Sigma}_2(t)$ correspond to the cyclic errror basis functions for $S_{\psi 2}(t)$ in that the leading terms of $\Sigma_2(t)$ and $\tilde{\Sigma}_2(t)$ are sinusoids with the same time-varying argument as that of $S_{\psi 2}(t)$.

Signals $S_1$, $\tilde{S}_1$, $\Sigma_1(t)$, $\tilde{\Sigma}_1(t)$, $\Sigma_2(t)$, and $\tilde{\Sigma}_2(t)$ and coefficients $A_R^2 A_1 A_{-1}$, and are $-A_R^2 A_1 B_{-1}$ transmitted to processor 34 and coefficients $A_R^2 A_1 A_{-1}$, and $-A_R^2 A_1 B_{-1}$ stored in processor 34 under the control of signal 72 for generation of conjugated quadratures $\Sigma_3(t)$ and $\tilde{\Sigma}_3(t)$ where $$\Sigma_3(t) \equiv \sum_1 \cdot \sum_2 - \tilde{\sum}_1 \cdot \tilde{\sum}_2 - 3[A_R^2 A_1 A_{-1} S_1 - A_R^2 A_1 B_{-1} \tilde{S}_1] \quad (47)$$

$$= A_R^2 A_1^2 \begin{bmatrix} 3\varepsilon_{-1} \cos(\varphi_R + \varphi + 2\zeta_1 + \zeta_{-1} - 2\zeta_R) + \\ A_1 \cos(\varphi_R + 3\varphi + 2\zeta_1 + \zeta_1 - 2\zeta_R) + \\ 3\varepsilon_2 \cos(\varphi_R + 4\varphi + 2\zeta_1 + \zeta_2 - 2\zeta_R) + \\ 3\varepsilon_3 \cos(\varphi_R + 5\varphi + 2\zeta_1 + \zeta_3 - 2\zeta_R) \end{bmatrix} -$$

$$3[A_R^2 A_1 A_{-1} S_1 - A_R^2 A_1 B_{-1} \tilde{S}_1] + A_R^2 A_1 O(\varepsilon_i \varepsilon_j) + \ldots,$$

$$\Sigma_3(t) = A_R^2 A_1^2 \begin{bmatrix} A_1 \cos(\varphi_R + 3\varphi + 3\zeta_1 - 2\zeta_R) + \\ 3\varepsilon_2 \cos(\varphi_R + 4\varphi + 2\zeta_1 + \zeta_2 - 2\zeta_R) + \\ 3\varepsilon_3 \cos(\varphi_R + 5\varphi + 2\zeta_1 + \zeta_3 - 2\zeta_R) \end{bmatrix} + \quad (48)$$

$$A_R^2 A_1 O(\varepsilon_i \varepsilon_j) + \ldots,$$

$$\tilde{\Sigma}_3(t) \equiv \sum_1 \cdot \tilde{\sum}_2 - \tilde{\sum}_1 \cdot \sum_2 - 3[A_R^2 A_1 A_{-1} \tilde{S}_1 - A_R^2 A_1 B_{-1} S_1] \quad (49)$$

$$= A_R^2 A_1^2 \begin{bmatrix} 3\varepsilon_{-1} \sin(\varphi_R + \varphi + 2\zeta_1 + \zeta_{-1} - 2\zeta_R) + \\ A_1 \sin(\varphi_R + 3\varphi + 2\zeta_1 + \zeta_1 - 2\zeta_R) + \\ 3\varepsilon_2 \sin(\varphi_R + 4\varphi + 2\zeta_1 + \zeta_2 - 2\zeta_R) + \\ 3\varepsilon_3 \sin(\varphi_R + 5\varphi + 2\zeta_1 + \zeta_3 - 2\zeta_R) \end{bmatrix} -$$

$$3[A_R^2 A_1 A_{-1} \tilde{S}_1 - A_R^2 A_1 B_{-1} S_1] + A_R^2 A_1 O(\varepsilon_i \varepsilon_j) + \ldots$$

$$\tilde{\Sigma}_3(t) = A_R^2 A_1^2 \begin{bmatrix} A_1 \sin(\varphi_R + 3\varphi + 3\zeta_1 - 2\zeta_R) + \\ 3\varepsilon_2 \sin(\varphi_R + 4\varphi + 2\zeta_1 + \zeta_2 - 2\zeta_R) + \\ 3\varepsilon_3 \sin(\varphi_R + 5\varphi + 2\zeta_1 + \zeta_3 - 2\zeta_R) \end{bmatrix} + \quad (50)$$

$$A_R^2 A_1 O(\varepsilon_i \varepsilon_j) + \ldots.$$

Signals $\Sigma_3(t)$ and $\tilde{\Sigma}_3(t)$ correspond to the cyclic errror basis functions for $S_{\psi 3}(t)$ in that the leading terms of $\Sigma_3(t)$ and $\tilde{\Sigma}_3(t)$ are sinusoids with the same time-varying argument as that of $S_{\psi 3}(t)$.

Coefficients $A_R A_1^2 A_2$ and $-A_R A_1^2 B_2$ (where $A_2$ and $B_2$ are cyclic error coefficients for $S_{\psi 2}$ and are given explicitly by Equations (67) and (68), respectively, further below) are next determined through digital low pass filters, e.g., low pass Butterworth filters, in processor 38. The input signals for the digital filters are $\Sigma_5(t)$ and $\tilde{\Sigma}_5(t)$, respectively. The input signals are generated in processor 38 using signals $S_1$, $\tilde{S}_1$, $\Sigma_2(t)$, and $\tilde{\Sigma}_2(t)$ according to the formulae $$\Sigma_5(t) = [S_1(t)\Sigma_2(t) + \tilde{S}_1(t)\tilde{\Sigma}_2(t)], \quad (51)$$

$$\tilde{\Sigma}_5(t) = [S_1(t)\tilde{\Sigma}_2(t) - \tilde{S}_1(t)\Sigma_2(t)] \quad (52)$$

The expansions of $\Sigma_5(t)$ and $\tilde{\Sigma}_5(t)$, given by Equations (51) and (52), respectively, in terms of cyclic error and non-cyclic error terms are $$\sum_5(t) = A_R A_1^2 A_2 + \quad (53)$$

$$A_R A_1^2 \begin{Bmatrix} \varepsilon_{-1}[2\cos(-\varphi + \zeta_{-1} - \zeta_R) + \cos(3\varphi + 2\zeta_1 - \zeta_{-1} - \zeta_R)] + \\ A_1 \cos(\varphi + \zeta_1 - \zeta_R) + \\ 2\varepsilon_2 \cos(2\varphi + \zeta_2 - \zeta_R) + \\ \varepsilon_3[2\cos(3\varphi + \zeta_3 - \zeta_R) + \cos(-\varphi + 2\zeta_1 - \zeta_3 - \zeta_R)] \end{Bmatrix} +$$

$$A_R A_1 O(\varepsilon_i^2) + \ldots,$$

$$\tilde{\sum}_5(t) = -A_R A_1^2 B_2 + \quad (54)$$

$$A_R A_1^2 \begin{Bmatrix} \varepsilon_{-1}[2\sin(-\varphi + \zeta_{-1} - \zeta_R) + \sin(3\varphi + 2\zeta_1 - \zeta_{-1} - \zeta_R)] + \\ A_1 \sin(\varphi + \zeta_1 - \zeta_R) + \\ 2\varepsilon_2 \sin(2\varphi + \zeta_2 - \zeta_R) + \\ \varepsilon_3[2\sin(3\varphi + \zeta_3 - \zeta_R) + \sin(-\varphi + 2\zeta_1 - \zeta_3 - \zeta_R)] \end{Bmatrix} +$$

$$A_R A_1 O(\varepsilon_i^2) + \ldots,$$

where $A_2$ and $B_2$ are given by Equations (67) and (68), respectively, shown further below.

Signals $\Sigma_5(t)$ and $\tilde{\Sigma}_5(t)$ are sent to low pass digital filters in processor 38, e.g., low pass Butterworth filters, where coefficients $A_R A_1^2 A_2$ and $-A_R A_1^2 B_2$ are determined. For a Butterworth filter $T_n(x)$ of order n, the corresponding outputs of the low pass digital filters for inputs $\Sigma_5(t)$ and $\tilde{\Sigma}_5(t)$ are $$T_n[\Sigma_5(t)] = A_R A_1^2 A_2 + A_R A_1^2 \quad (55)$$
$$\left[ A_1 O\left(\frac{\omega_c}{\omega_D}\right)^n + 2\varepsilon_{-1} O\left(\frac{\omega_c}{\omega_D}\right)^n + \varepsilon_{-1} O\left(\frac{\omega_c}{3\omega_D}\right)^n + \right.$$
$$\left. 2\varepsilon_2 O\left(\frac{\omega_c}{2\omega_D}\right)^n + 2\varepsilon_3 O\left(\frac{\omega_c}{3\omega_D}\right)^n + \varepsilon_3 O\left(\frac{\omega_c}{\omega_D}\right)^n \right]$$

$$T_n[\tilde{\Sigma}_5(t)] = -A_R A_1^2 B_2 + A_R A_1^2 \quad (56)$$
$$\left[ A_1 O\left(\frac{\omega_c}{\omega_D}\right)^n + 2\varepsilon_{-1} O\left(\frac{\omega_c}{\omega_D}\right)^n + \varepsilon_{-1} O\left(\frac{\omega_c}{3\omega_D}\right)^n + \right.$$
$$\left. 2\varepsilon_2 O\left(\frac{\omega_c}{2\omega_D}\right)^n + 2\varepsilon_3 O\left(\frac{\omega_c}{3\omega_D}\right)^n + \varepsilon_3 O\left(\frac{\omega_c}{\omega_D}\right)^n \right]$$

The terms on the right hand sides of Equations (55) and (56) with factors $A_R A_1^3$ are the sources of the largest errors and accordingly determine the specifications of n and the minimum ratio for $\omega_D/\omega_c$ that can be used when the outputs of processor 38 are stored in table 40. For a fourth order Butterworth filter, i.e., n=4, and a minimum ratio for $\omega_D/\omega_c = 7$, the error terms on the right hand side of Equations (55) and (56) will generate errors that correspond to $\lesssim 0.010$ nm (3σ). The outputs $A_R A_1^2 A_2$ and $-A_R A_1^2 B_2$ of low pass filters of processor 38 are the outputs of processor 38. When the stage is moving at a speed such that the corresponding Doppler shift frequency $\omega_D/2\pi$ is 10 to 100 times greater than the bandwidth of the stage servo control system and the requirement with respect to $\omega_D/\omega_c$ is satisfied, the outputs $A_R A_1^2 A_2$ and $-A_R A_1^2 B_2$ of processor 38 are stored in table 40 under the control of signal 72.

Coefficients $A_R^2 A_1^3 A_3$ and $-A_R^2 A_1^3 B_3$ (where $A_3$ and $B_3$ are cyclic error coefficients for $S_{\psi 3}$ and are given explicitly by Equations (69) and (70), respectively, further below) are next determined through a digital low pass filter, e.g., a low pass Butterworth filter, in processor 36. The input signals for the digital filters are $\Sigma_6(t)$ and $\tilde{\Sigma}_6(t)$, respectively. The input signals are generated in processor 36 using signals $S_1$, $\tilde{S}_1$, $\Sigma_3(t)$, and $\tilde{\Sigma}_3(t)$ according to the formulae $$\Sigma_6(t) = [S_1(t)\Sigma_3(t) + \tilde{S}_1(t)\tilde{\Sigma}_3(t)], \quad (57)$$

$$\tilde{\Sigma}_6(t) = [S_1(t)\Sigma_3(t) - \tilde{S}_1(t)\tilde{\Sigma}_3(t)] \quad (58)$$

The expansions of $\Sigma_6(t)$ and $\tilde{\Sigma}_6(t)$ given by Equations (57) and (58), respectively, in terms of cyclic error and non-cyclic error terms are $$\Sigma_6(t) = A_R^2 A_1^3 A_3 + A_R^2 A_1^3 \quad (59)$$
$$\begin{bmatrix} \varepsilon_{-1}\cos(4\varphi - \zeta_{-1} + 3\zeta_1 - 2\zeta_R) + \\ A_1\cos(2\varphi - \zeta_1 + 3\zeta_1 - 2\zeta_R) + \\ \varepsilon_2\cos(\varphi - \zeta_2 + 3\zeta_1 - 2\zeta_R) + \\ 3\varepsilon_2\cos(3\varphi + \zeta_1 + \zeta_2 - 2\zeta_R) + \\ 3\varepsilon_3\cos(4\varphi + \zeta_1 + \zeta_3 - 2\zeta_R) + \end{bmatrix} +$$
$$A_R^2 A_1^2 O(\varepsilon_i^2) + \ldots,$$

$$\tilde{\Sigma}_6(t) = -A_R^2 A_1^3 B_3 + A_R^2 A_1^3 \quad (60)$$
$$\begin{bmatrix} \varepsilon_{-1}\sin(4\varphi - \zeta_{-1} + 3\zeta_1 - 2\zeta_R) + \\ A_1\sin(2\varphi - \zeta_1 + 3\zeta_1 - 2\zeta_R) + \\ \varepsilon_2\sin(\varphi - \zeta_2 + 3\zeta_1 - 2\zeta_R) + \\ 3\varepsilon_2\sin(3\varphi + \zeta_1 + \zeta_2 - 2\zeta_R) + \\ 3\varepsilon_3\sin(4\varphi + \zeta_1 + \zeta_3 - 2\zeta_R) + \end{bmatrix} +$$
$$A_R^2 A_1^2 O(\varepsilon_i^2) + \ldots.$$

where $A_3$ and $B_3$ are given by Equations (69) and (70), respectively.

Signals $\Sigma_6(t)$ and $\tilde{\Sigma}_6(t)$ are sent to low pass digital filters in processor 36, e.g., low pass Butterworth filters, where coefficients $A_R^2 A_1^3 A_3$ and $-A_R^2 A_1^3 B_3$ are determined. For a Butterworth filter $T_n(x)$ of order n, the corresponding outputs of the low pass digital filters for inputs $\Sigma_6(t)$ and $\tilde{\Sigma}_6(t)$ are $$T_n[\Sigma_6(t)] = A_R^2 A_1^3 A_3 + A_R^2 A_1^3 \quad (61)$$
$$\left[ A_1 O\left(\frac{\omega_c}{2\omega_D}\right)^n + \varepsilon_{-1} O\left(\frac{\omega_c}{4\omega_D}\right)^n + \right.$$
$$\left. \varepsilon_2 O\left(\frac{\omega_c}{\omega_D}\right)^n + 3\varepsilon_2 O\left(\frac{\omega_c}{3\omega_D}\right)^n + 3\varepsilon_3 O\left(\frac{\omega_c}{4\omega_D}\right)^n \right]$$

$$T_n[\tilde{\Sigma}_6(t)] = -A_R^2 A_1^3 B_3 + A_R^2 A_1^3 \quad (62)$$
$$\left[ A_1 O\left(\frac{\omega_c}{2\omega_D}\right)^n + \varepsilon_{-1} O\left(\frac{\omega_c}{4\omega_D}\right)^n + \right.$$
$$\left. \varepsilon_2 O\left(\frac{\omega_c}{\omega_D}\right)^n + 3\varepsilon_2 O\left(\frac{\omega_c}{3\omega_D}\right)^n + 3\varepsilon_3 O\left(\frac{\omega_c}{4\omega_D}\right)^n \right]$$

The terms on the right hand sides of Equations (61) and (62) with factors $A_R^2 A_1^4$ are the sources of the largest errors and accordingly determined the specifications of n and the minimum ratio for $\omega_D/\omega_c$ that can be used when the outputs of processor 36 are stored in table 40. For a fourth order Butterworth filter, i.e., n=4, and a minimum ratio for $\omega_D/\omega_c = 3.5$, the error terms on the right hand side of Equations (61) and (62) will generate errors that correspond to $\lesssim 0.010$ nm (3σ). The outputs $A_R^2 A_1^3 A_3$ and $-A_R^2 A_1^3 B_3$ of low pass filters of processor 36 are the outputs of processor 36. When the stage is moving at a speed such that the corresponding Doppler shift frequency $\omega_D/2\pi$ is 10 to 100 times greater than the bandwidth of the stage servo control system and the requirement with respect to $\omega_D/\omega_c$ is satisfied, the outputs $A_R^2 A_1^3 A_3$ and $-A_R^2 A_1^3 B_3$ of processor 36 are stored in table 40 under the control of signal 72.

Finally, quadratures $S$ and $\tilde{S}$ are transmitted from processors 52 and 56 respectively to processor 18 for the purpose of determining a value for $A_1^2$. First, a signal $S(t)S(t)+\tilde{S}(t)\tilde{S}(t)$ is generated where $$S(t)S(t) + \tilde{S}(t)\tilde{S}(t) = A_1^2 + [\varepsilon_{-1}^2 + \varepsilon_0^2 + \varepsilon_2^2 + \varepsilon_3^2] + \quad (63)$$
$$2A_1\varepsilon_{-1}\cos(2\varphi + \zeta_1 - \zeta_{-1}) +$$
$$2A_1\varepsilon_0\cos(\varphi + \zeta_1 - \zeta_0) +$$
$$2A_1\varepsilon_2\cos(-\varphi + \zeta_1 - \zeta_2) +$$
$$2A_1\varepsilon_3\cos(-2\varphi + \zeta_1 - \zeta_3) +$$
$$O(\varepsilon_i \varepsilon_j).$$

The signal of Equation (63) is sent to a low pass digital filter in processor 18, e.g., a low pass Butterworth filter, where the coefficient $A_1^2$ is determined. For a Butterworth filter $T_n(x)$ of order n, the corresponding outputs of the low pass digital filter for the signal of Equation (63) is $$T_n\left[S(t) \cdot S(t) + \tilde{S}(t) \cdot \tilde{S}(t)\right] = A_1^2 + [\varepsilon_{-1}^2 + \varepsilon_0^2 + \varepsilon_2^2 + \varepsilon_3^2] + A_1 \quad (64)$$

$$\left[\begin{array}{l} 2\varepsilon_{-1} O\left(\frac{\omega_c}{2\omega_D}\right)^n + 2\varepsilon_0 O\left(\frac{\omega_c}{\omega_D}\right)^n + \\ 2\varepsilon_2 O\left(\frac{\omega_c}{\omega_D}\right)^n + 2\varepsilon_3 O\left(\frac{\omega_c}{2\omega_D}\right)^n \end{array}\right]$$

The accuracy required for the determination of $A_1^2$ is approximately 0.5% in order to limit errors generated in the computation of cyclic error signals $S_{\psi j}$ to $\leq 0.010$ nm (3σ). Therefore the error terms $\varepsilon_{-1}^2$, $\varepsilon_0^2$, $\varepsilon_2^2$, and $\varepsilon_2^2$ on the right hand side of Equation (64) are negligible. The terms on the right hand side of Equation (64) of the form $$O\left(\frac{\omega_c}{\omega_D}\right)^n$$

are the sources of the largest Doppler shift frequency dependent errors and accordingly determine the specifications of n and the minimum ratio for $\omega_D/\omega_c$ that can be used when the output of processor 18 is stored in table 40. For a second order Butterworth filter, i.e., n=2, and a minimum ratio for $\omega_D/\omega_c = 3.5$, the Doppler shift frequency dependent error terms on the right hand side of Equation (64) will generate errors that correspond to $\leq 0.010$ nm (3σ). The output $A_1^2$ of the low pass filter of processor 18 is the output of processor 18. When the stage is moving at a speed such that the corresponding Doppler shift frequency $\omega_D/2\pi$ is 10 to 100 times greater than the bandwidth of the stage servo control system and the requirement with respect to $\omega_D/\omega_c$ is satisfied, the output $A_1^2$ of processor 18 is stored in table 40 under the control of signal 72.

Referring now to FIG. 1*b*, processor 60 generates the compensating error signal $S_\psi$. With respect to generating signal $S_\psi$, it is beneficial to rewrite the $\varepsilon_{-1}$, $\varepsilon_0$, $\varepsilon_2$, and $\varepsilon_3$ cyclic error terms of $S_\psi$ in terms of the highest order time dependent terms of $\Sigma_{-1}(t)$, $\tilde{\Sigma}_{-1}(t)$, $S_R$, $\tilde{S}_R$, $\Sigma_2(t)$, $\tilde{\Sigma}_2(t)$, $\Sigma_3(t)$, and $\tilde{\Sigma}_3(t)$, i.e., $\cos(\phi_R - \phi - \zeta_1 + 2\zeta_R)$, $\sin(\phi_R - \phi - \zeta_1 + 2\zeta_R)$, $\cos(\phi_R + \zeta_R)$, $\sin(\phi_R + \zeta_R)$, $\cos(\phi_R + 2\phi + 2\zeta_1 - \zeta_R)$, $\sin(\phi_R + 2\phi + 2\zeta_1 - \zeta_R)$, $\cos(\phi_R + 3\phi + 3\zeta_1 - 2\zeta_R)$, and $\sin(\phi_R + 3\phi + 3\zeta_1 - 2\zeta_R)$ as $$S_\psi(t) = \left[\begin{array}{l} \varepsilon_{-1}\cos(\zeta_1 + \zeta_{-1} - 2\zeta_R)\cos(\phi_R - \phi - \zeta_1 + 2\zeta_R) - \\ \varepsilon_{-1}\sin(\zeta_1 + \zeta_{-1} - 2\zeta_R)\sin(\phi_R - \phi - \zeta_1 + 2\zeta_R) \end{array}\right] + \quad (65)$$

$$\left[\begin{array}{l} \varepsilon_0\cos(\zeta_0 - \zeta_R)\cos(\phi_R + \zeta_R) - \\ \varepsilon_0\sin(\zeta_0 - \zeta_R)\sin(\phi_R + \zeta_R) \end{array}\right] +$$

$$\left[\begin{array}{l} \varepsilon_2\cos(-2\zeta_1 + \zeta_2 + \zeta_R)\cos(\phi_R + 2\phi + 2\zeta_1 - \zeta_R) - \\ \varepsilon_2\sin(-2\zeta_1 + \zeta_2 + \zeta_R)\sin(\phi_R + 2\phi + 2\zeta_1 - \zeta_R) \end{array}\right] +$$

$$\left[\begin{array}{l} \varepsilon_3\cos(-3\zeta_1 + \zeta_3 + 2\zeta_R)\cos(\phi_R + 3\phi + 3\zeta_1 - 2\zeta_R) - \\ \varepsilon_3\sin(-3\zeta_1 + \zeta_3 + 2\zeta_R)\sin(\phi_R + 3\phi + 3\zeta_1 - 2\zeta_R) \end{array}\right].$$

Equation (65) for $S_\psi$ is next written in the form $$S_\psi(t) = [A_{-1}\cos(\phi_R - \phi - \zeta_1 + 2\zeta_R) - B_{-1}\sin(\phi_R - \phi - \zeta_1 + 2\zeta_R)] + \quad (66)$$

$$[A_0\cos(\phi_R + \zeta_R) - B_0\sin(\phi_R + \zeta_R)] +$$

$$[A_2\cos(\phi_R + 2\phi + 2\zeta_1 - \zeta_R) - B_2\sin(\phi_R + 2\phi + 2\zeta_1 - \zeta_R)] +$$

$$[A_3\cos(\phi_R + 3\phi + 3\zeta_1 - 2\zeta_R) - B_3\sin(\phi_R + 3\phi + 3\zeta_1 - 2\zeta_R)]$$

where $A_{-1}$, $B_{-1}$, $A_0$, and $B_0$ are given by equations (37), (38), (22), and (23), respectively, and $$A_2 = \varepsilon_2 \cos(-2\zeta_1 + \zeta_2 + \zeta_R), \quad (67)$$

$$B_2 = \varepsilon_2 \sin(-2\zeta_1 + \zeta_2 + \zeta_R), \quad (68)$$

$$A_3 = \varepsilon_3 \cos(-3\zeta_1 + \zeta_3 + 2\zeta_R), \quad (69)$$

$$B_3 = \varepsilon_3 \sin(-3\zeta_1 + \zeta_3 + 2\zeta_R). \quad (70)$$

Compensation error signal $S_\psi$ is generated in processor 44 using Equation (66), the coefficients transmitted from table 40 as signal 42, and the signals $\Sigma_{-1}(t)$, $\tilde{\Sigma}_{-1}(t)$, $S_R$, $\tilde{S}_R$, $\Sigma_2(t)$, $\tilde{\Sigma}_2(t)$, $\Sigma_3(t)$, and $\tilde{\Sigma}_3(t)$ (which comprise the cyclic error basis functions). Explicitly, $$S_\psi(t) = \left[\left(\frac{A_R^2 A_1 A_{-1}}{(A_R^2)^2 A_1^2}\right)\Sigma_{-1} + \left(\frac{-A_R^2 A_1 B_{-1}}{(A_R^2)^2 A_1^2}\right)\tilde{\Sigma}_{-1}\right] + \quad (71)$$

$$\left[\left(\frac{A_R A_0}{A_R^2}\right)S_R - \left(\frac{A_R B_0}{A_R^2}\right)\tilde{S}_R\right] +$$

$$\left[\left(\frac{A_R A_1^2 A_2}{A_R^2 (A_1^2)^2}\right)\Sigma_2 + \left(\frac{-A_R A_1^2 B_2}{A_R^2 (A_1^2)^2}\right)\tilde{\Sigma}_2\right] +$$

$$\left[\left(\frac{A_R^2 A_1^3 A_3}{(A_R^2)^2 (A_1^2)^3}\right)\Sigma_3 + \left(\frac{-A_R^2 A_1^3 B_3}{(A_R^2)^2 (A_1^2)^3}\right)\tilde{\Sigma}_3\right]$$

In other words, the compensation error signal is generated form a superposition of the error basis functions weighted by the cyclic error coefficients.

The compensating signal $S_\psi$ is subtracted from signal S in processor 46 under control of signal 76 to generate compensated signal $S - S_\psi$. Control signal 76 determines when signal S is to be compensated. The phase $\phi = 4kL$ is then extracted from the compensated signal with a subsequent processor (not shown) to, for example, provide a more accurate measurement of the distance L.

In the presently preferred embodiment, the error compensation signal $S_\psi(t)$ is derived from prior values of the signals $S(t)$, $\tilde{S}(t)$, $S_R(t)$ and $\tilde{S}_R(t)$. For example, feedforward signals $S'(t)$, $\tilde{S}'(t)$, $S'_R(t)$ and $\tilde{S}_R(t)$ (as described in Equations (14), (15), (16), and (17)) may replace signals $S(t)$, $\tilde{S}(t)$, $S_R(t)$ and $\tilde{S}_R(t)$ in the calculation of the cyclic error coefficients, the cyclic error basis functions, and the error compensation signal based on them. Furthemore, feedforward values for $S'(t)$ and $S'_R(t)$ may replace $S(t)$ and $S_R(t)$ in the calculation of quadrature signals $\tilde{S}(t)$ and $\tilde{S}_R(t)$ according to Equations (11) and (12). As a result, the compensation of the signal $S(t)$ in processor 46 can proceed at a high data rate because the error compensation signal $S_\psi(t)$ will have already been generated when processor 46 receives the real-time values of signal $S(t)$ and the only real-time operation is the subtraction of the error compensation signal $S_\psi(t)$ from the main signal $S(t)$. This feature is especially useful in the context of an interferometric stage system operating under servo control because the high data rate of the cyclic error compensation introduces negligible data age to the servo position information derived from the compensated signal.

In further embodiments, the cyclic error coefficients may be stored and updated at a lower data rate than that used to generate the cyclic error basis functions from the feedforward values. In such cases, the stored values for the cyclic error coefficients may used for the calculation of the cyclic error basis functions as necessary. Of course, in yet further embodiments, the coefficients and/or the error basis functions can be calculated in real time, without the use of the feedforward signals.

An important assumption in the preferred embodiment of the cyclic error compensation described above is that the Doppler shift frequency $d\phi(t)/dt$ is small enough relative to the heterodyne frequency $\omega_R$, that the quadrature signal $\tilde{S}(t)$ can be approximated (in analogy to Equation (10) by the expression:

$$\tilde{S}(t) = (\cot\omega_R\tau)S(t-2\tau) - \frac{\cos 2\omega_R\tau}{\sin\omega_R\tau}S(t-\tau), \quad (72)$$

or the simpler expression given by Equation (12). In further embodiments, the quadrature signal $\tilde{S}(t)$ may be more accurately calculated according to:

$$\tilde{S}(t) = (\cot\omega_M\tau)S(t-2\tau) - \frac{\cos 2\omega_M\tau}{\sin\omega_M\tau}S(t-\tau), \quad (73)$$

where $\omega_M$ is the instantaneous rate of change of the phase of the main interference signal $S(t)$, which can be determined with sufficient accuracy by assuming that the cyclic error contributions to $S(t)$ are negligle.

Also, in further embodiments, the cyclic error compensation technique may be used for cyclic errors terms different from those explicitly described in Equations (3)–(6). In particular, using algebraic combinations of the signals $S(t)$, $\tilde{S}(t)$, $S_R(t)$, and $\tilde{S}_R(t)$, a processing unit can generate cyclic error basis functions, which are sine and cosine functions that have the same time-varying arguments as the cyclic error terms that need to be compensated, and then use the cyclic error basis functions to project out respective cyclic error coefficients from $S(t)$ and $\tilde{S}(t)$ by low-pas filtering (e.g., averaging).

For example, to determine the coefficients for a half-cycle cyclic error of the form:

$$S_{\psi(1/2)} = \varepsilon_{1/2}\cos\left(\varphi_R + \frac{\varphi}{2} + \zeta_{1/2}\right), \quad (74)$$

one can calculater cyclic error basis functions for the half-cycle cyclic error according as follows. First calculate signals $\Sigma'_7(t)$ and $\tilde{\Sigma}'_7(t)$ as:

$$\Sigma'_7(t) = \sqrt{\frac{\Sigma_0 - (A_R A_0 - A_R A_1)}{2A_R A_1}} \quad (75)$$

$$\tilde{\Sigma}'_7(t) = \sqrt{\frac{(A_R A_0 + A_R A_1) - \Sigma_0}{2A_R A_1}}. \quad (76)$$

Notably, the leading term of $\Sigma'_7(t)$ is $|\cos(\phi/2+\zeta_1/2-\zeta_R/2)|$, and the leading term of $\tilde{\Sigma}'_7(t)$ is $|\sin(\phi/2+\zeta_1/2-\zeta_R/2)|$. Zero phase crossings in $\Sigma'_7(t)$ and $\tilde{\Sigma}'_7(t)$ are then measured to remove the absolute value operation and define $\Sigma_7(t)$ and $\tilde{\Sigma}_7(t)$, which have leading terms $\cos(\phi/2+\zeta_1/2-\zeta_R/2)$ and $\sin(\phi/2+\zeta_1/2-\zeta_R/2)$, respectively.

Half-cycle error basis functions $\Sigma_{1/2}(t)$ and $\tilde{\Sigma}_{1/2}(t)$ are then generated as:

$$\Sigma_{1/2}(t)=\Sigma_7(t)S_R(t)-\tilde{\Sigma}_7(t)\tilde{S}_R(t) \quad (77)$$

$$\tilde{\Sigma}_{1/2}(t)=\Sigma_7(t)S_R(t)+\tilde{\Sigma}_7(t)\tilde{S}_R(t) \quad (78)$$

where $\Sigma_{1/2}(t)$ and $\tilde{\Sigma}_{1/2}(t)$ have as their leading terms sine and cosine functions, respectively, whose time-dependent argument is the same as that of $S_{\psi(1/2)}$. To determine the coefficients for $S_{\psi(1/2)}$, one projects half-cycle error basis functions onto $S(t)$ and $\tilde{S}(t)$ to move the half-cycle cyclic error component to zero frequency, for example:

$$\Sigma_8(t)=S(t)\Sigma_{1/2}(t)+\tilde{S}(t)\tilde{\Sigma}_{1/2}(t) \quad (79)$$

$$\tilde{\Sigma}_8(t)=\tilde{S}(t)\Sigma_{1/2}(t)-S(t)\tilde{\Sigma}_{1/2}(t) \quad (80).$$

Low-pass filtering (e.g., with the Butterworth filter) of $\Sigma_8(t)$ and $\tilde{\Sigma}_8(t)$ then yield the half-cycle error coefficients in analogy to the extraction of the previously described cyclic error coefficients. In particular, the leading terms following the low-pass filtering are $A_R A_{1/2} \cos(\zeta_{1/2}-\zeta_1/2-\zeta_R/2)$ and $A_R A_{1/2} \sin(\zeta_{1/2}-\zeta_1/2-\zeta_R/2)$, respectively.

Finally, it is noted that, if desired, the accuracy of the cyclic error correction can further be improved to higher order in the amplitude of the cyclic error coefficients by iterating the compensation of the main signal $S(t)$. In other words, for each subsequent iteration the compensated signal for the main signal is used to generate corresponding cyclic error basis functions and determine a higher order correction to each of the cyclic error coefficients.

Figure 2:
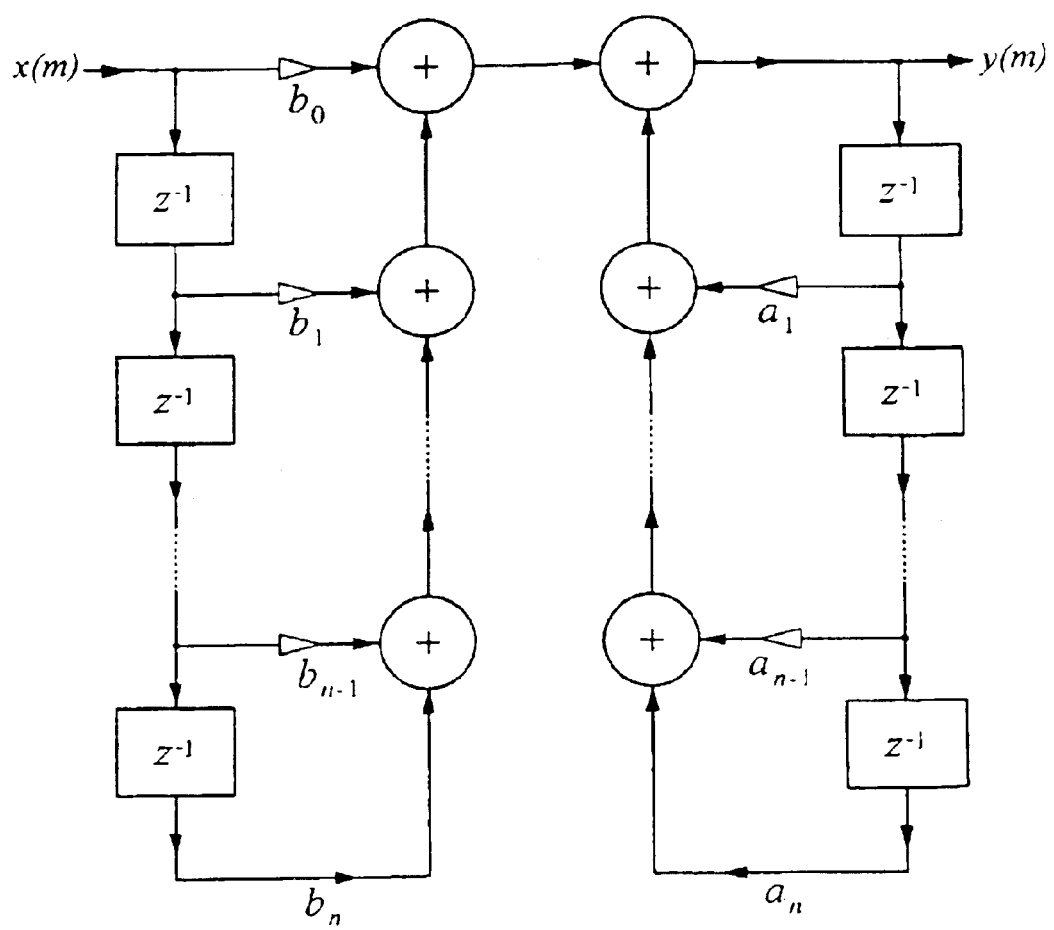
FIG. 2 is a schematic diagram of an $M^{th}$ order digital filter for use in low-pass filtering algebraic combinations of the main signal, the reference signal, their quadrature signals, and the error basis functions to yield the cyclic error coefficients.

Referring now to FIG. 2, a block diagram is shown for an $M^{th}$ order digital filter used in the cyclic error compensation described above. The figure is in the "Direct Form I" representation standard to the digital signal processing community. The input discrete time series is $x(n)$ and the output discrete time series is $y(n)$. The $z^{-1}$ operation indicates a one-sample delay. A time-domain representation of the filter takes the form:

$$y(n)=b_0x(n)+b_1x(n-1)+b_2x(n-2)+\ldots+b_Mx(n-M)-a_1y(n-1)-a_2y(n-2)-\ldots-a_My(n-M) \quad (81).$$

The coefficients $a_i$ and $b_i$ are selected to produce the desired properties for the filter. For the case of the Butterworth filter, the $a_i$ and $b_i$ coefficients are selected to produce the frequency filtering given by Equations 28, 29, 43, 44, 55, and 56. Furthermore, other embodiments of the cyclic error compensaiton may implement different low-pass filtering schemes to yield the coefficients of low-frequency terms. The Butterworth filter, and other low-pass digital filters, are well known in the art. See, for example: Oppenhiem, A. V., Schafer, R. W., and, J. R. Buck, "Discrete-Time Signal Processing", Upper Saddle River, N.J.: Prentice Hall, 1999; and Proakis, J. G., and, D. G. Manolakis, "Digital Signal Processing: Principles, Algorithms, and Applications", New York, N.Y.: MacMillan, 1992.

Depending on the embodiment, the compensation technique described above can be implemented in hardware or software, or a combination of both. The technique can be implemented in computer programs using standard programming techniques following the method and figures described herein. Program code is applied to input data to perform the functions described herein and generate output information. The output information is applied to one or more output devices such as the servo control system.

Each program may be implemented in a high level procedural or object oriented programming language to communicate with a computer system, or the programs can be implemented in assembly or machine language, if desired. In any case, the language can be a compiled or interpreted language. Moreover, the program can run on dedicated integrated circuits preprogrammed for that purpose.

Each such computer program may be stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The compensation technique can also be implemented as a computer-readable storage medium, configured with a computer program, where the storage medium so configured causes a computer to operate in a specific and predefined manner to perform the functions described herein.

Figure 3:
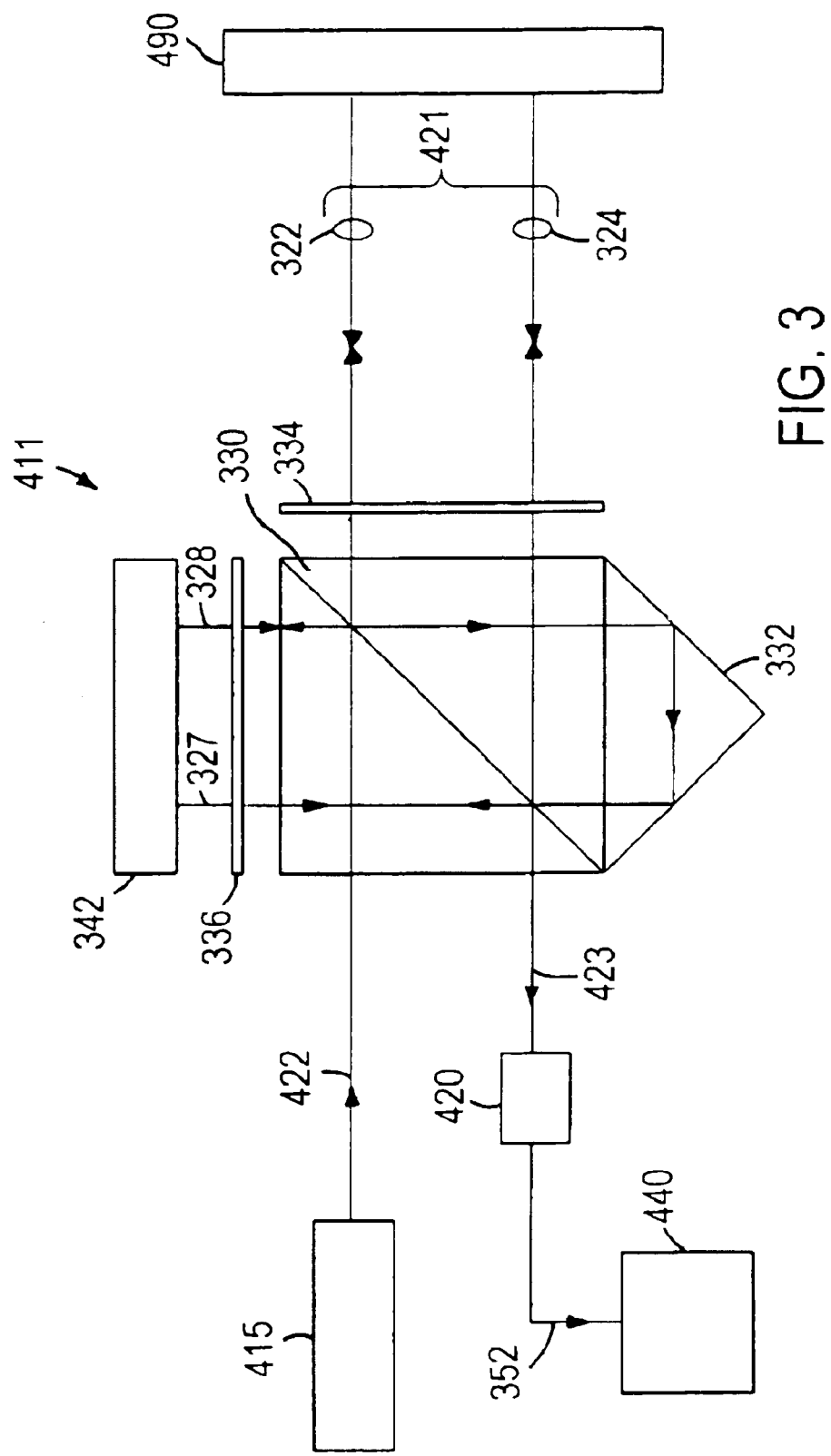
FIG. 3 is a schematic diagram of an interferometry system including a high-stability plane mirror interferometer (HSPMI).

Now referring to FIG. 3, an interferometry system including a high stability plane mirror interferometer (HSPMI) 311 is shown for optical generating the main interference signal. The HSPMI 311 includes a polarization beam-splitter 330, a retroreflector 332, quarter wave phase retardation plates 334 and 336, and a plane mirror reference object 342. Input beam 422 is a two-component beam. The two components have different frequencies and are orthogonally plane polarized. The different frequencies can be produced in source 415, for example, by laser Zeeman splitting, by acousto-optical modulation, or internal to the laser using birefringent elements or the like. HSPMI 311 splits input beam 422 into two components. One component, shown as first and second pass measurement beams 322 and 324, reflects from measurement object 490 twice before exiting HSPMI 311. The other component, shown by first and second pass reference beams 328 and 327, reflect from reference mirror 342 twice before exiting HSPMI 311. The exiting beam components overlap and form output beam 423.

An electrical interference signal 352 is generated by the detection of output beam 423 in detector 420. Detector 420 includes a polarizer to mix the reference and measurement beam components of output beam 423 with respect to polarization. Electrical interference signal 352 contains a heterodyne interference signal corresponding to main interference signal S(t).

In further embodiments, the interferometry system may be different than that shown in FIG. 3. In particular, the cyclic error compensation technique is applicable to other types of interferometers as well. For example, the main interference signal S(t) may be produced by an interferometry system that may include any of single and/or multiple pass interferometers, passive interferometers, dynamic interferometers, and dispersion interferometers. Furthermore, the interferometry system may monitor one or more degrees of freedom, each of which may produce a corresponding main interference signal S(t), which may be compensated for cyclic errors as disclosed herein. Furthermore, the degree(s) of freedom monitored by the interferometry system may include any of changes in distance to a measurement object, changes in relative distance between two measurement objects, changes in the angular orientation of a measurement object, and changes in the direction of the input beam.

Examples of dynamic interferometers are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill. Examples of angular displacement interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272,034. Examples of interferometry systems for measuring more than one degree of freedom and for reducing beam shear are described in U.S. patent application Ser. No. 10/352,616 filed Jan. 28, 2003 and entitled "MULTIPLE-PASS INTERFEROMETRY" by Henry A. Hill and U.S. patent application Ser. No. 10/351,708 filed Jan. 27, 2003 and entitled "MULTI-AXIS INTERFEROMETER" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93–106 (1989). Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

Because of the cyclic error compensation, the interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p.82 (1997).

Overlay depends directly on the performance, i.e., accuracy and precision, of the distance measuring interferometers used to position the wafer and reticle (or mask) stages. Since a lithography tool may produce $50–100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithoraphy: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 4:
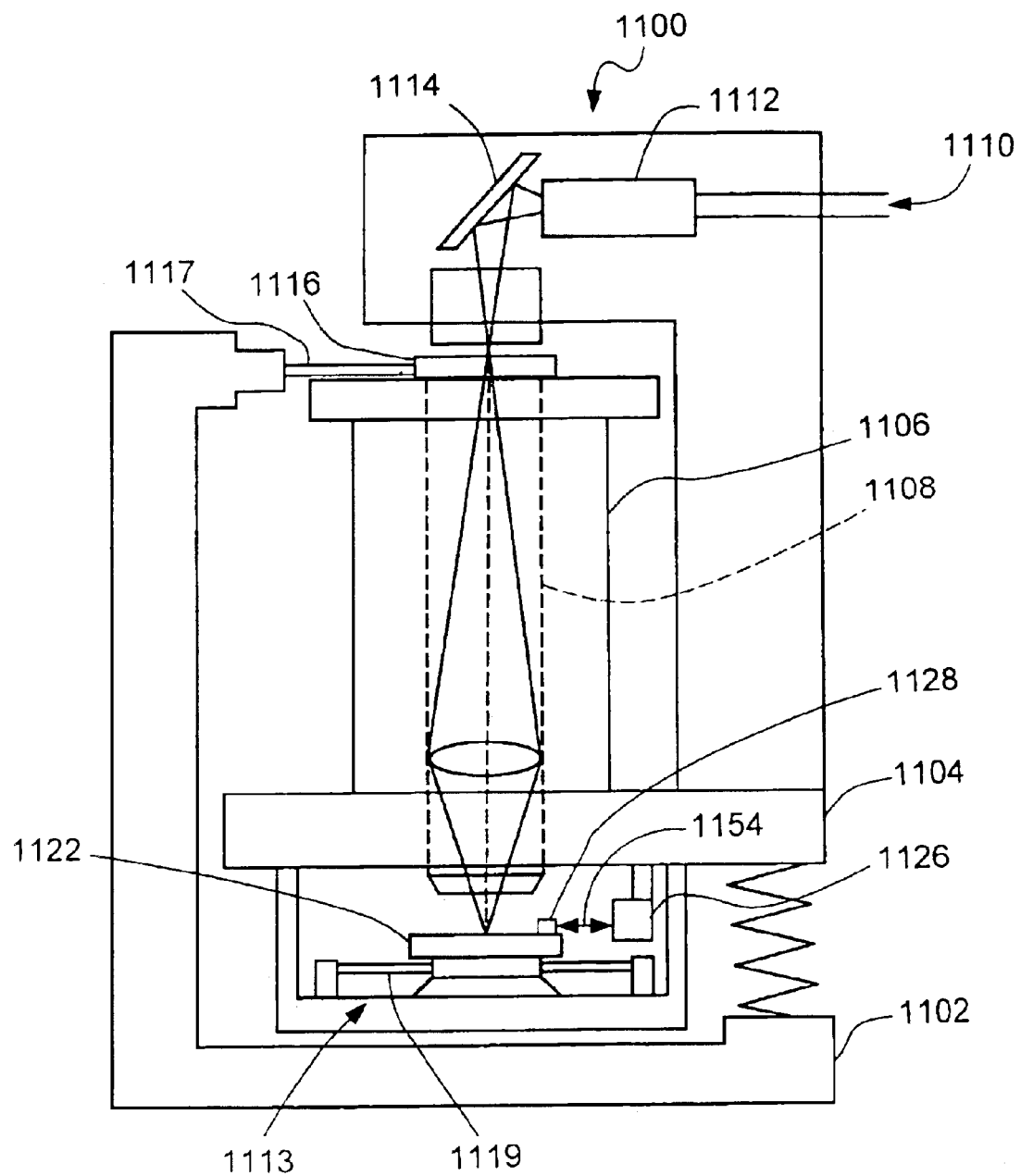
FIG. 4 is a schematic diagram of an embodiment of a lithography tool that includes an interferometer.

An example of a lithography scanner 1100 using an interferometry system 1126 is shown in FIG. 4. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 5A:
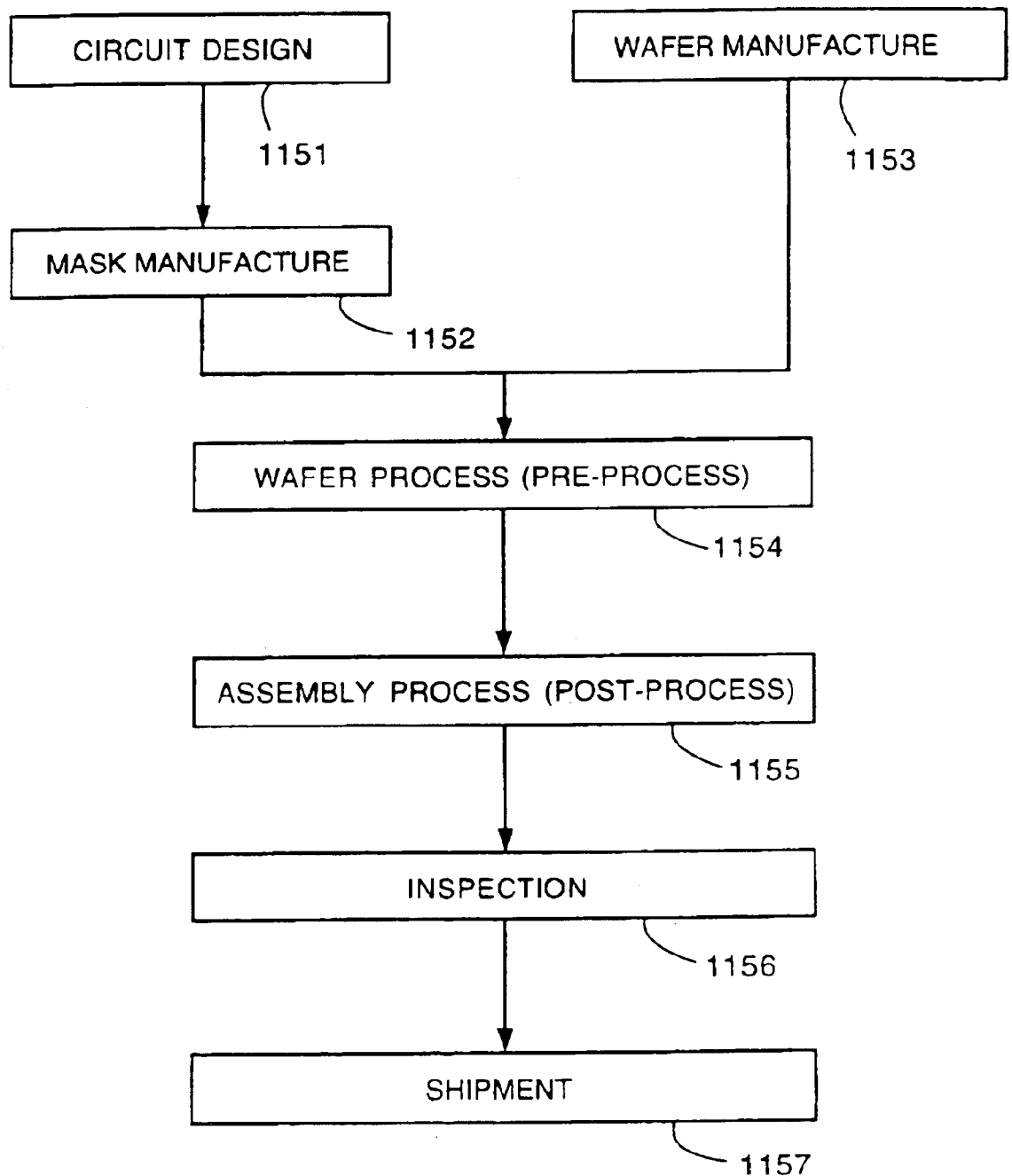
FIG. 5(a) and FIG. 5(b) are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 5(a) and 5(b). FIG. 5(a) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 5B:
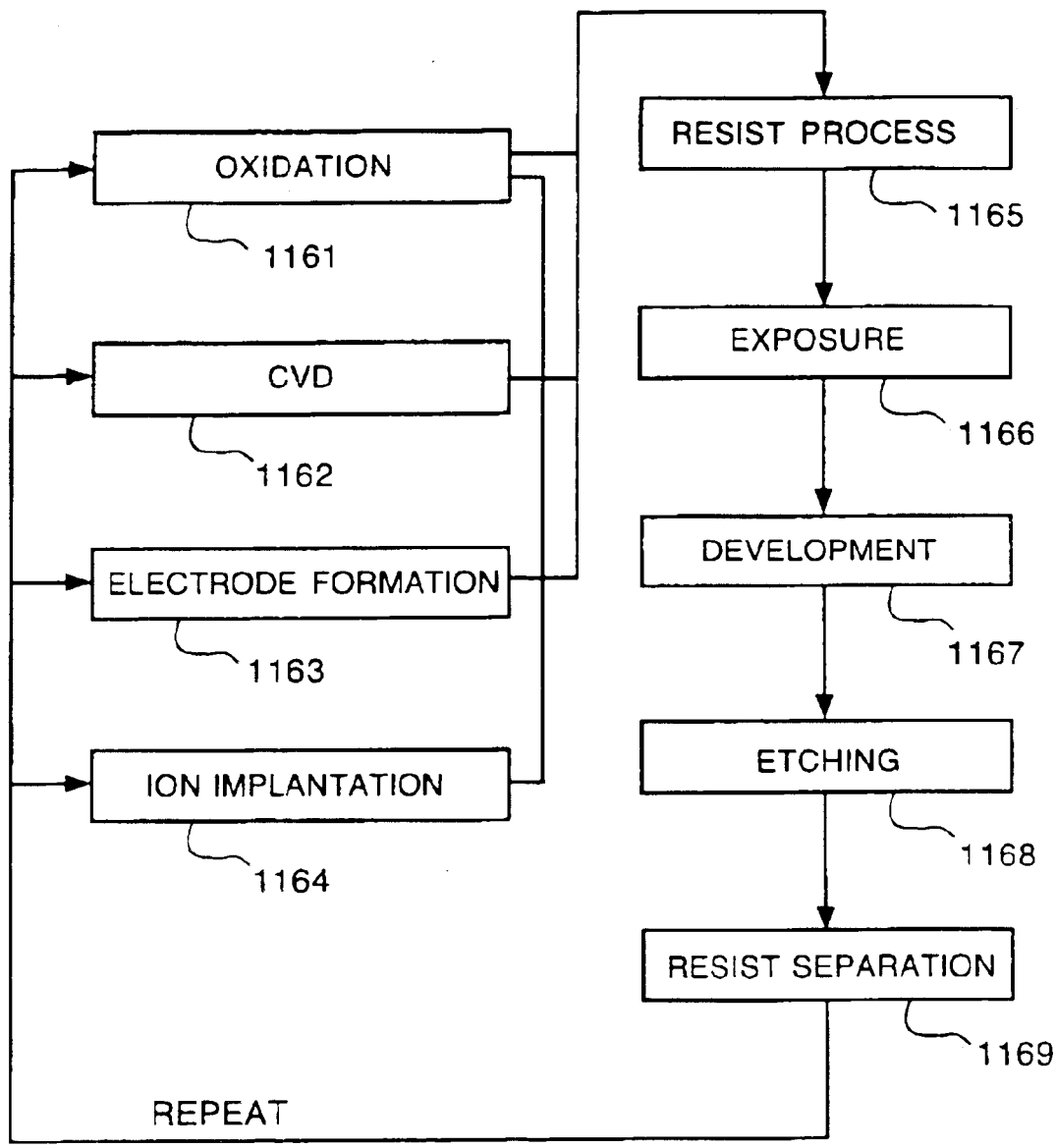

FIG. 5(b) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 6:
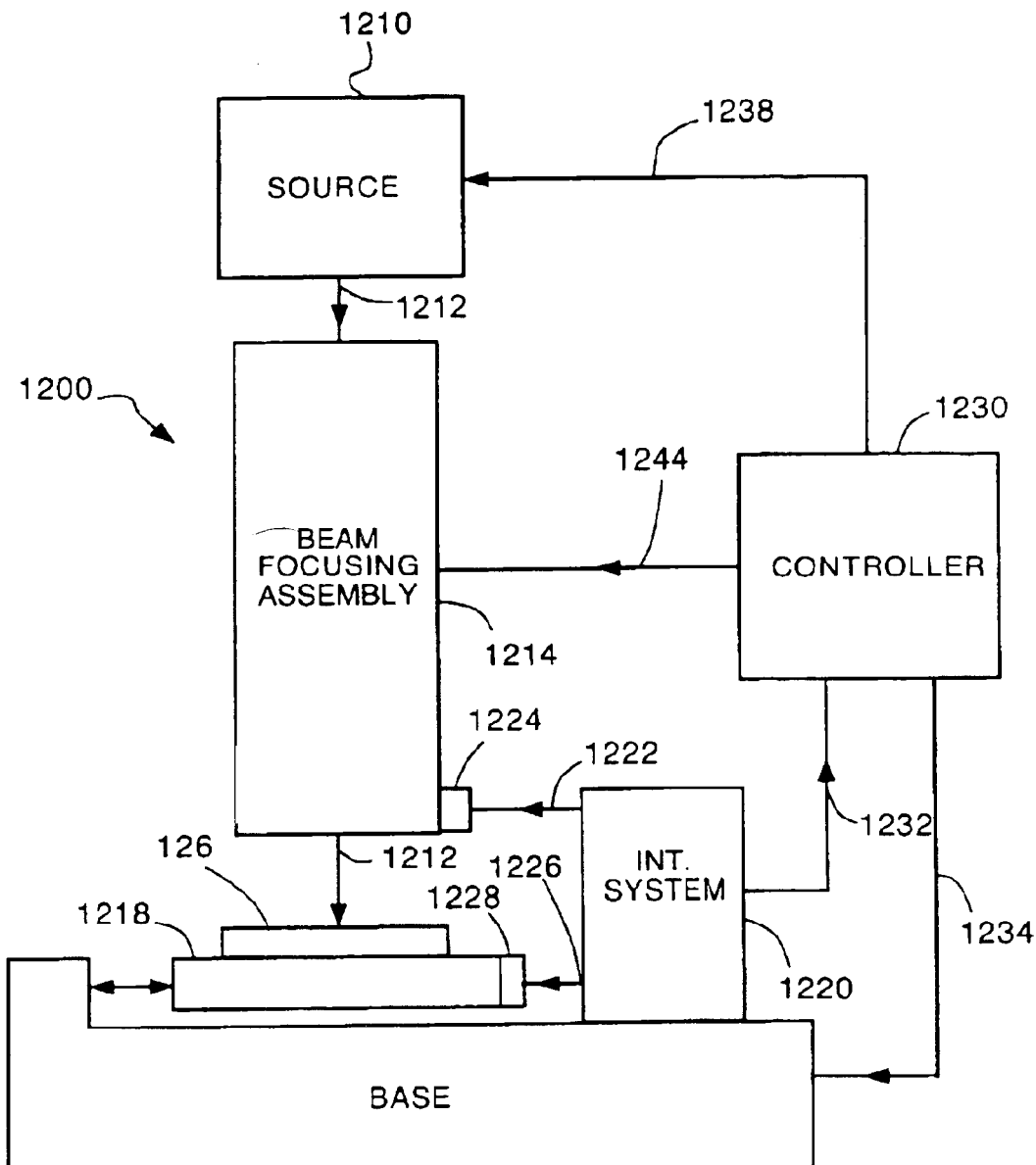
FIG. 6 is a schematic of a beam writing system that includes an interferometry system.

As an example, a schematic of a beam writing system 1200 is shown in FIG. 6. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method comprising:

providing an interference signal S(t) from two beams directed along different paths, wherein the signal S(t) is indicative of changes in an optical path difference $n\tilde{L}(t)$ between the different paths, where n is an average refractive index along the different paths, $\tilde{L}(t)$ is a total physical path difference between the different paths, and t is time;

providing one or more coefficients representative of one or more errors that cause the signal S(t) to deviate from an ideal expression of the form $A_1 \cos(\omega_R t + \phi(t) + \zeta_1)$, where $A_1$ and $\zeta_1$ are constants, $\omega_R$ is an angular frequency difference between the two beams, and $\phi(t) = n/k\tilde{L}(t)$, with $k=2\pi/\lambda$ and $\lambda$ equal to a wavelength for the beams;

calculating a function of values of the signal S(t); and reducing the deviation of S(t) from the ideal expression using an error signal $S_\psi(t)$ generated from the coefficients and one or more error basis functions derived at least in part from the function of values of the signal S(t).

2. The method of claim 1, further comprising directing the two beams along the different paths and measuring the interference signal S(t).

3. The method of claim 2, wherein at least one of the beams is directed to reflect from a movable measurement object before producing the interference signal S(t).

4. The method of claim 3, wherein the beam directed to contact the movable measurement object reflects from the measurement object multiple times before producing the interference signal S(t).

5. The method of claim 3, wherein the beams are directed to reflect from different locations of the movable measurement object before producing the interference signal S(t).

6. The method of claim 1, wherein the errors correspond to spurious beam paths.

7. The method of claim 1, wherein the deviation can be expressed as $$\sum_{m,p} A_{m,p} \cos\left(\omega_R t + \frac{m}{p}\varphi(t) + \zeta_{m,p}\right),$$

where p=1, 2, 3 ..., and m is any integer not equal to p, and where the provided coefficients comprise information corresponding to at least some of $A_{m,p}$ and $\zeta_{m,p}$.

8. The method of claim 1, wherein the interference signal S(t) is provided at a data rate that is an integer multiple of $\omega_R/2\pi$.

9. The method of claim 1, wherein the error basis functions correspond to one or more pairs of sine and cosine functions having an argument whose time-varying component has the form $\omega_R t+(m/p)\phi(t)$, where p is a positive integer and m is an integer not equal to p.

10. The method of claim 9, wherein the error basis functions correspond to multiple pairs of the sine and cosine functions.

11. The method of claim 10, wherein the error basis functions comprise multiple pairs of the sine and cosine functions from a family of the sine and cosine functions with {(p=1,m=−1),(p=1,m=0),(p=1,m=2),(p=1,m=3), and (p=2, m=1)}.

12. The method of claim 1, further comprising generating the error signal $S_\psi(t)$.

13. The method of claim 12, the error signal $S_\psi(t)$ is generated from a superposition of the error basis functions weighted by the coefficients representative of the errors.

14. The method of claim 1, wherein reducing the deviation comprises subtracting the error signal $S_\psi(t)$ from the interference signal S(t).

15. The method of claim 1, further comprising determining a value for the optical path difference $n\bar{L}(t)$ from the interference signal S(t) after its deviations are reduced.

16. The method of claim 1, wherein $\omega_R>100\cdot d\phi(t)/dt$.

17. The method of claim 1, wherein $\omega_R>500\cdot d\phi(t)/dt$.

18. The method of claim 1, wherein calculating the function of values of the signal S(t) comprises calculating a quadrature signal $\tilde{S}(t)$ based on the signal S(t).

19. The method of claim 18, wherein the error basis functions are derived from the signals S(t) and $\tilde{S}(t)$.

20. The method of claim 19, wherein $\omega_R$ is non-zero.

21. The method of claim 20, further comprising:
providing a reference signal $S_R(t)=A_R \cos(\omega_R t+\zeta_R)$, where $A_R$ and $\zeta_R$ are constants; and
calculating a quadrature reference signal $\tilde{S}_R(t)$ based on the signal $S_R(t)$,
wherein the error basis functions are derived from the signals S(t), $\tilde{S}(t)$, $S_R(t)$, and $\tilde{S}_R(t)$.

22. The method of claim 21, further comprising measuring the reference signal $S_R(t)$ based on an output from a common source of the two beams.

23. The method of claim 19, wherein calculating the quadrature signal $\tilde{S}(t)$ comprises calculating the quadrature signal $\tilde{S}(t)$ based on the expression $$\tilde{S}(t) = (\cot\omega_M \tau)S(t-2\tau) - \frac{\cos 2\omega_M \tau}{\sin\omega_M \tau}S(t-\tau),$$

where τ>0 and $\omega_M$ is an instantaneous rate of change of a phase of the interference signal S(t).

24. The method of claim 23, wherein calculating the quadrature signal $\tilde{S}(t)$ further comprises approximating $\omega_M$ according to $\omega_M \approx \omega_R+d\phi(t)/dt$, where $\phi(t)$ in the expression for $\omega_M$ is determined from the interference signal S(t) assuming the deviation of S(t) from the ideal expression is negligible.

25. The method of claim 23, wherein calculating the quadrature signal $\tilde{S}(t)$ further comprises approximating $\omega_M$ according to $\omega_M \approx \omega_R$.

26. The method of claim 25, wherein calculating the quadrature signal $\tilde{S}(t)$ comprises calculating the quadrature signal $\tilde{S}(t)$ according to the simplified expression $$\tilde{S}(t) = \frac{1}{\sqrt{3}}[S(t-\tau) + S(t-2\tau)]$$

for $\tau=(\pi+6\pi N)/3\omega_R$, where N is a non-negative integer.

27. The method of claim 21, wherein calculating the quadrature reference signal $\tilde{S}_R(t)$ comprises calculating the quadrature reference signal $\tilde{S}_R(t)$ based on the expression $$\tilde{S}_R(t) = (\cot\omega_R \tau)S_R(t-2\tau) - \frac{\cos 2\omega_R \tau}{\sin\omega_R \tau}S_R(t-\tau),$$

where τ>0.

28. The method of claim 27, wherein calculating the quadrature reference signal $\tilde{S}_R(t)$ comprises calculating the quadrature reference signal $\tilde{S}_R(t)$ according to the simplified expression $$\tilde{S}_R(t) = \frac{1}{\sqrt{3}}[S_R(t-\tau) + S_R(t-2\tau)]$$

for $\tau=(\pi+6\pi N)/3\omega_R$, where N is a non-negative integer.

29. The method of claim 19, further comprising generating the error basis functions from the signals S(t) and $\tilde{S}(t)$.

30. The method of claim 21, further comprising generating the error basis functions from the signals S(t), $\tilde{S}(t)$, $S_R(t)$, and $\tilde{S}_R(t)$.

31. The method of claim 30, wherein the error basis functions are generated from algebraic combinations of the signals S(t), $\tilde{S}(t)$, $S_R(t)$, and $\tilde{S}_R(t)$.

32. The method of claim 19, wherein the quadrature signal $\tilde{S}(t)$ is calculated from the interference signal S(t) based on prior values of S(t) according to the approximation $\tilde{S}(t) \approx S(t-2\pi N/\omega_R)$, where N is a positive integer.

33. The method of claim 19, wherein the error basis functions used to generate the error signal $S_\psi(t)$ are derived from prior values of the signals S(t) and $\tilde{S}(t)$ according to the approximations $S(t) \approx S(t-2\pi N/\omega_R)$ and $\tilde{S}(t) \approx \tilde{S}(t-2\pi M/\omega_R)$, where N and M are positive integers.

34. An apparatus comprising a computer readable medium which during operation causes a processor to perform the method of claim 1.

35. A method comprising:
providing an interference signal $S(t)$ from two beams derived from a common source and directed along different paths, wherein the signal $S(t)$ is indicative of changes in an optical path difference $n\tilde{L}(t)$ between the different paths, where n is an average refractive index along the different paths, $\tilde{L}(t)$ is a total physical path difference between the different paths, and t is time;
providing coefficients representative of one or more errors that cause the signal $S(t)$ to deviate from an ideal expression of the form $A_1 \cos(\omega_R t + \phi(t) + \zeta_1)$, where $A_1$ and $\zeta_1$ are constants, $\omega_R$ is an angular frequency difference between the two beams, and $\phi(t) = nk\tilde{L}(t)$, with $k = 2\pi/\lambda$ and $\lambda$ equal to a wavelength for the beams; and
reducing the deviation of $S(t)$ from the ideal expression using an error signal $S_\psi(t)$ generated from the coefficients and error basis functions derived from the interference signal $S(t)$ based on prior values of $S(t)$ according to the approximation $S(t) \approx S(t - 2\pi N/\omega_R)$, where N is a positive integer.

36. The method of claim 35, wherein $\omega_R > 100 \cdot d\phi(t)/dt$.

37. The method of claim 35, further comprising providing a reference signal $S_R(t) = A_R \cos(\omega_R t + \zeta_R)$, where $\omega_R$ is non-zero and $A_R$ and $\zeta_R$ are constants, and wherein the error basis functions are derived from the signals $S(t)$ and $S_R(t)$.

38. The method of claim 37, wherein the derivation of the error basis functions is based on prior values of $S_R(t)$ according to $S_R(t) = S_R(t - 2\pi M/\omega_R)$, where M is a positive integer.

39. An apparatus comprising a computer readable medium which during operation causes a processor to perform the method of claim 35.

40. A method for estimating coefficients representative of one or more errors that cause an interference signal $S(t)$ from two beams derived from a common source and directed along different paths to deviate from an ideal expression of the form $A_1 \cos(\omega_R t + \phi(t) + \zeta_1)$, wherein the signal $S(t)$ is indicative of changes in an optical path difference $n\tilde{L}(t)$ between the different paths,
where n is an average refractive index along the different paths, $\tilde{L}(t)$ is a total physical path difference between the different paths, t is time, $A_1$ and $\zeta_1$ are constants, $\omega_R$ is an angular frequency difference between the two beams, and $\phi(t) = nk\tilde{L}(t)$, with $k = 2\pi/\lambda$ and $\lambda$ equal to a wavelength for the beams,
the method comprising:
calculating a quadrature signal $\tilde{S}(t)$ based on the signal $S(t)$; and
calculating an estimate for the coefficients based on the signals $S(t)$ and $\tilde{S}(t)$.

41. The method of claim 40, further comprising:
providing a reference signal $S_R(t) = A_R \cos(\omega_R t + \zeta_R)$, where $\omega_R$ is non-zero and $A_R$ and $\zeta_R$ are constants; and
calculating a quadrature reference signal $\tilde{S}_R(t)$ based on the signal $S_R(t)$,
wherein the estimate for the coefficients is based on the signals $S(t)$, $\tilde{S}(t)$, $S_R(t)$, and $\tilde{S}_R(t)$.

42. The method of claim 40, wherein calculating the estimate for the coefficients comprises generating error basis functions derived from the signals $S(t)$ and $\tilde{S}(t)$.

43. The method of claim 41, wherein calculating the estimate for the coefficients comprises generating error basis functions derived from the signals $S(t)$, $\tilde{S}(t)$, $S_R(t)$, and $\tilde{S}_R(t)$.

44. The method of claim 43, wherein the error basis functions correspond to one or more pairs of sine and cosine functions having an argument whose time-varying component has the form $\omega_R t + (m/p)\phi(t)$, where p is a positive integer and m is an integer not equal to p.

45. The method of claim 44, wherein the error basis functions are generated from algebraic combinations of the signals $S(t)$, $\tilde{S}(t)$, $S_R(t)$, and $\tilde{S}_R(t)$.

46. The method of claim 44, wherein the error basis functions correspond to multiple pairs of the sine and cosine functions.

47. The method of claim 46, wherein the error basis functions comprise multiple pairs of the sine and cosine functions from a family of the sine and cosine functions with $\{(p=1,m=-1),(p=1,m=0),(p=1,m=2),(p=1,m=3)$, and $(p=2, m=1)\}$.

48. The method of claim 42, wherein calculating the estimate for the coefficients comprises low-pass filtering algebraic combinations of the error basis functions and the signals $S(t)$ and $\tilde{S}(t)$.

49. The method of claim 43, wherein calculating the estimate for the coefficients comprises low-pass filtering algebraic combinations of the error basis functions and the signals $S(t)$ and $\tilde{S}(t)$.

50. The method of claim wherein 48, the low-pass filtering comprises using a Butterworth filter.

51. The method of claim 49, wherein the low-pass filtering comprises using a Butterworth filter.

52. An apparatus comprising a computer readable medium which during operation causes a processor to perform the method of claim 40.

53. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the method of claim 1, 35, or 40.

54. A method fof fabricating integrated circuits, the method comprising the lithography method of claim 53.

55. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 1, 35, or 40; and
imaging the spatially patterned radiation onto a wafer.

56. A method for fabricating integrated circuits, the method comprising the lithography method of claim 55.

57. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 1, 35, or 40.

58. A method for fabricating integrated circuits, the method comprising the lithography method of claim 57.

59. A method for fabricating a lithography mask, the method comprising:
directing a write beam to a substrate to pattern the substrate;
positioning the substrate relative to the write beam; and monitoring the position of the substrate relative to the write beam using the interferometry method of claim 1, 35, or 40.

60. An apparatus comprising:

an interferometry system which during operation directs two beams along different paths and provides an interference signal S(t) from the two beams, wherein the signal S(t) is indicative of changes in an optical path difference $n\tilde{L}(t)$ between the different paths, where n is an average refractive index along the different paths, $\tilde{L}(t)$ is a total physical path difference between the different paths, and t is time, wherein imperfections in the interferometry system produce one or more errors that cause the signal S(t) to deviate from an ideal expression of the form $A_1 \cos(\omega_R t + \phi(t) + \zeta_1)$, where $A_1$ and $\zeta_1$ are constants, $\omega_R$ is an angular frequency difference between the two beams, and $\phi(t) = nk\tilde{L}(t)$, with $k=2\pi/\lambda$ and $\lambda$ equal to a wavelength for the beams; and an electronic processor which during operation receives the interference signal S(t) from the interferometry system, receives one or more coefficients representative of the one or more errors, calculates a function of values of the signal S(t), and reduces the deviation of S(t) from the ideal expression using an error signal $S_\psi(t)$ generated from the coefficients and one or more error basis functions derived at least in part from the function of values of the signal S(t).

61. An apparatus comprising:

an interferometry system which during operation directs two beams derived from a common source along different paths and provides an interference signal S(t) from the two beams, wherein the signal S(t) is indicative of changes in an optical path difference $n\tilde{L}(t)$ between the different paths, where n is an average refractive index along the different paths, $\tilde{L}(t)$ is a total physical path difference between the different paths, and t is time, wherein imperfections in the interferometry system produce one or more errors that cause the signal S(t) to deviate from an ideal expression of the form $A_1 \cos(\omega_R t + \phi(t) + \zeta_1)$, where $A_1$ and $\zeta_1$ are constants, $\omega_R$ is an angular frequency difference between the two beams, and $\phi(t) = nk\tilde{L}(t)$, with $k=2\pi/\lambda$ and $\lambda$ equal to a wavelength for the beams; and an electronic processor which during operation receives the interference signal S(t) from the interferometry system, receives coefficients representative of the one or more errors, and reduces the deviation of S(t) from the ideal expression using an error signal $S_\psi(t)$ generated from the coefficients and error basis functions derived from the interference signal S(t) based on prior values of S(t) according to the approximation $S(t) \approx S(t - 2\pi N/\omega_R)$, where N is a positive integer.

62. An apparatus comprising:

an interferometry system which during operation directs two beams derived from a common source along different paths and provides an interference signal S(t) from the two beams, wherein the signal S(t) is indicative of changes in an optical path difference $n\tilde{L}(t)$ between the different paths, where n is an average refractive index along the different paths, $\tilde{L}(t)$ is a total physical path difference between the different paths, and t is time, wherein imperfections in the interferometry system produce one or more errors that cause the signal S(t) to deviate from an ideal expression of the form $A_1 \cos(\omega_R t + \phi(t) + \zeta_1)$, where $A_1$ and $\zeta_1$ are constants, $\omega_R$ is an angular frequency difference between the two beams, and $\phi(t) = nk\tilde{L}(t)$, with $k=2\pi/\lambda$ and $\lambda$ equal to a wavelength for the beams; and an electronic processor which during operation receives the interference signal S(t) from the interferometry system, calculates a quadrature signal $\tilde{S}(t)$ based on the signal S(t), and calculates an estimate for the coefficients representative of the one or more errors based on the signals S(t) and $\tilde{S}(t)$.

63. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the imaged radiation; and the apparatus of claim 60, 61, or 62 for monitoring the position of the wafer relative to the imaged radiation.

64. A lithography system for use in fabricating integrated circuits on a wafer, the system comprising:

a stage for supporting the wafer; and an illumination system a radiation source, a mask, a positioning system, a lens assembly, and the apparatus of claim 60, 61, or 62, wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

65. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the apparatus of claim 60, 61, or 62 for monitoring the position of the stage relative to the beam directing assembly.

66. A method for fabricating integrated circuits, the method comprising using the lithography system of claim 63.

67. A method for fabricating integrated circuits, the method comprising using the lithography system of claim 64.

* * * * *

UNITED STATES PATENT AND TRADEMARK OFFICE
CERTIFICATE OF CORRECTION

PATENT NO. : 6,950,192 B2
APPLICATION NO. : 10/616504
DATED : September 27, 2005
INVENTOR(S) : Henry A. Hill It is certified that error appears in the above-identified patent and that said Letters Patent is hereby corrected as shown below:

On the title page, item:

Abstract, line 10, replace "$A_1 \cos(\omega_R t + \phi(t) + \zeta_1)$" with --$A_1 \cos(\omega_R t + \varphi(t) + \zeta_1)$--

Abstract, line 12, replace "$\phi(t) = nk\tilde{L}(t)$" with --$\varphi(t) = nk\tilde{L}(t)$--

Page 2
Column 2, "Mitsuru Tanaka, et al." reference, replace second occurrence of "pp."

Column 32

Line 54, replace "$A_1 \cos(\omega_R t + \phi(t) + \zeta_1)$" with --$A_1 \cos(\omega_R t + \varphi(t) + \zeta_1)$--

Lines 56 and 57, replace "$\phi(t) = nk\tilde{L}(t)$" with --$\varphi(t) = nk\tilde{L}(t)$--

Column 33

Line 28, replace "$\omega_R t + (m/p)\phi(t)$" with --$\omega_R t + (m/p)\varphi(t)$--

Line 49, replace "$\omega_R > 100 \cdot d\phi(t)/dt$" with --$\omega_R > 100 \cdot d\varphi(t)/dt$--

Line 50, replace "$\omega_R > 500 \cdot d\phi(t)/dt$" with --$\omega_R > 500 \cdot d\varphi(t)/dt$--

Column 34

Line 1, replace "$\omega_M \approx \omega_R + d\phi(t)/dt$, where $\phi(t)$" with --$\omega_M \approx \omega_R + d\varphi(t)/dt$, where $\varphi(t)$--

Column 35

Line 11, replace "$A_1 \cos(\omega_R t + \phi(t) + \zeta_1)$" with --$A_1 \cos(\omega_R t + \varphi(t) + \zeta_1)$--

Line 13, replace "$\phi(t) = nk\tilde{L}(t)$" with --$\varphi(t) = nk\tilde{L}(t)$--

Line 22, replace "$\omega_R > 100 \cdot d\phi(t)/dt$" with --$\omega_R > 100 \cdot d\varphi(t)/dt$--

Line 38, replace "$A_1 \cos(\omega_R t + \phi(t) + \zeta_1)$" with --$A_1 \cos(\omega_R t + \varphi(t) + \zeta_1)$--

Line 46, replace "$\phi(t) = nk\tilde{L}(t)$" with --$\varphi(t) = nk\tilde{L}(t)$--

UNITED STATES PATENT AND TRADEMARK OFFICE
CERTIFICATE OF CORRECTION

PATENT NO.       : 6,950,192 B2
APPLICATION NO.  : 10/616504
DATED            : September 27, 2005
INVENTOR(S)      : Henry A. Hill It is certified that error appears in the above-identified patent and that said Letters Patent is hereby corrected as shown below:

Column 36

Line 4, replace "$\omega_R t + (m/p)\phi(t)$" with --$\omega_R t + (m/p)\varphi(t)$--

Line 26, replace "claim wherein 48" with --claim 48, wherein--
Line 40, replace "fof" with --for--

Column 37

Line 16, replace "$A_1 \cos(\omega_R t + \phi(t) + \zeta_1)$" with --$A_1 \cos(\omega_R t + \varphi(t) + \zeta_1)$--

Line 18, replace "$\phi(t) = nk\tilde{L}(t)$" with --$\varphi(t) = nk\tilde{L}(t)$--

Line 43, replace "$A_1 \cos(\omega_R t + \phi(t) + \zeta_1)$" with --$A_1 \cos(\omega_R t + \varphi(t) + \zeta_1)$--

Line 45, replace "$\phi(t) = nk\tilde{L}(t)$" with --$\varphi(t) = nk\tilde{L}(t)$--

Column 38

Lines 7 and 8, replace "$A_1 \cos(\omega_R t + \phi(t) + \zeta_1)$" with --$A_1 \cos(\omega_R t + \varphi(t) + \zeta_1)$--

Line 10, replace "$\phi(t) = nk\tilde{L}(t)$" with --$\varphi(t) = nk\tilde{L}(t)$--

Line 33, between "system" and "a" insert --including--

Signed and Sealed this

Seventh Day of November, 2006

JON W. DUDAS
*Director of the United States Patent and Trademark Office*